US012727163B2

(12) United States Patent
Choi et al.

(10) Patent No.: US 12,727,163 B2
(45) Date of Patent: Sep. 1, 2026

(54) NONVOLATILE MEMORY DEVICE AND MEMORY SYSTEM COMPRISING THE SAME

(71) Applicant: Samsung Electronics Co., Ltd., Suwon-si (KR)

(72) Inventors: Moorym Choi, Yongin-si (KR); Jungtae Sung, Seoul (KR); Sanghee Yoon, Hwaseong-si (KR); Wooyong Jeon, Anyang-si (KR); Junyoung Choi, Seoul (KR); Yoonjo Hwang, Gimpo-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 271 days.

(21) Appl. No.: 18/436,169

(22) Filed: Feb. 8, 2024

(65) Prior Publication Data

US 2024/0179912 A1 May 30, 2024

Related U.S. Application Data

(63) Continuation of application No. 17/368,029, filed on Jul. 6, 2021, now Pat. No. 11,930,638.

(30) Foreign Application Priority Data

Dec. 2, 2020 (KR) ........................ 10-2020-0166969

(51) Int. Cl.
*H10B 43/27* (2023.01)
*H10B 12/00* (2023.01)
*H10B 43/40* (2023.01)

(52) U.S. Cl.
CPC ............ *H10B 43/27* (2023.02); *H10B 12/50* (2023.02); *H10B 43/40* (2023.02)

(58) Field of Classification Search
CPC ........ H10B 43/27; H10B 12/50; H10B 43/40; H10B 41/41; H10B 41/27; H10B 41/50;
(Continued)

(56) References Cited

U.S. PATENT DOCUMENTS 8,971,118 B2 3/2015 Jin et al.
10,147,732 B1 12/2018 Hu et al.
(Continued)

FOREIGN PATENT DOCUMENTS

CN 104766865 A 7/2015
CN 111312715 A 6/2020
(Continued)

OTHER PUBLICATIONS

Korean Office Action dated Jan. 30, 2025 for corresponding Korean Patent Application No. 10-2020-0166969 and its English-language translation.

(Continued)

*Primary Examiner* — Davienne N Monbleau
*Assistant Examiner* — John Patrick Cornely
(74) *Attorney, Agent, or Firm* — Harness, Dickey & Pierce, P.L.C.

(57) ABSTRACT

A nonvolatile memory device includes a first structure and a second structure bonded to the first structure. The second structure includes a low-resistance conductive layer, a common source line layer on the low-resistance conductive layer, a stack structure above the common source line layer, a plurality of channel structures passing through a cell region of the stack structure and contacting the common source line layer, a dummy channel structure passing through a step region of the stack structure and contacting the common source line layer, a second insulating structure on the stack structure, a plurality of second bonding pads on
(Continued)

the second insulating structure, and a second interconnect structure in the second insulating structure.

20 Claims, 30 Drawing Sheets

(58) Field of Classification Search
CPC ........ H10B 43/50; H10B 41/35; H10B 43/35; H10W 90/00; H10W 20/43; H10W 72/90
See application file for complete search history.

(56) References Cited

U.S. PATENT DOCUMENTS

| | | | |
|---|---|---|---|
| 10,355,010 | B2 | 7/2019 | You et al. |
| 10,510,415 | B1 | 12/2019 | Huo et al. |
| 10,629,616 | B1 | 4/2020 | Kai et al. |
| 10,734,371 | B2 | 8/2020 | Park |
| 2017/0221813 | A1 | 8/2017 | Kim |
| 2018/0247949 | A1 | 8/2018 | Choi |
| 2019/0157284 | A1 | 5/2019 | Park et al. |
| 2019/0296041 | A1 | 9/2019 | Yamasaka et al. |
| 2020/0006375 | A1 | 1/2020 | Zhou |
| 2020/0251443 | A1 | 8/2020 | Kanakamedala et al. |
| 2020/0258817 | A1 | 8/2020 | Okina |
| 2020/0343161 | A1 | 10/2020 | Wu |

FOREIGN PATENT DOCUMENTS

| | | | |
|---|---|---|---|
| CN | 111758161 | A | 10/2020 |
| KR | 10-2017-0086746 | A | 7/2017 |
| KR | 10-2020-0133686 | A | 11/2020 |
| WO | 2020/219125 | A1 | 10/2020 |

OTHER PUBLICATIONS

Chinese Notice of Allowance dated Jun. 1, 2026 for corresponding Chinese Patent Application No. 202111305802.X and its English-language translation.

100
SS
SSa
SSb
270
210
250
260
220a
230a
220b
230b
IC2
BP2
BP1
IC1
PC
110
A
240
CELL
EXT
123
125
121
122
124
120
280
282
281
280Ha
280Hb
290
IL3
IL2c
IL2b
IL2a
IL2
IL1
S2
S1
Z
Y
X

100A
SS
EXT
CELL
EXT
B
B'
240
WS
DWS
X
Y
Z

100A
SS
270
210
250
260
220
230
IC2
BP2
BP1
IC1
PC
110
B'
EXT
DWS
DWSa
DWSb
DWSH
WS
WSH
290
121
122
123
124
125
120
IL3
IL2c
IL2b
IL2a
IL2
IL1
S2A
S1
B
Z
X
Y

FIG. 3B

PSb
PSa
235b
220b
235a
220a
260
255
210
215
240Hb
240Fa
240Ha
CELL
EXT
280Hb
280Fa
280Ha
IL2b
IL2c

FIG. 3K

SS
SSb
SSa
BP2
IC2
230b
220b
230a
220a
260
250
210
215
240
CELL
EXT
282 281
280
280Ha
280Hb
IL2a
IL2b
IL2c
IL2

FIG. 4A

PS
220
235
260
255
210
215
EXT
IL2b
IL2c

FIG. 4B

PS
220
235
260
255
210
215
EXT
WSH
DWSH
DWSH
WSH
IL2b
IL2c

FIG. 4D

EXT
WSH
DWSH
DWSH
WSH
220
235H
260
250
210
215
IL2b
IL2c

FIG. 4E

SS
230
220
260
255
210
215
EXT
WSH
DWSH
DWSH
WSH
IL2b
IL2c

FIG. 4F

SS
230
220
260
255
210
215
EXT
WSH
DWSH
DWSH
DWSF
WSH
WSF
IL2b
IL2c

FIG. 4G

SS
230
220
260
255
210
215
EXT
WSH
DWSH
DWSH
DWSF
WS
WSH
IL2b
IL2c

SS
230
220
260
255
210
215
EXT
WSH
DWSH
DWS
DWSb
DWSa
WS
WSH
IL2b
IL2c

SS
BP2
IC2
230
220
260
255
210
270
WSH
WS
DWSH
DWSb
DWSa
DWS
EXT
290
IL2a
IL2b
IL2c
IL3
IL2
S2A 2500
2210
2400
2100
2130
II'
II
2003
2300
2200
2003a
2003b
2003
2005
2001
2002
2006
2004
2000

NONVOLATILE MEMORY DEVICE AND MEMORY SYSTEM COMPRISING THE SAME

CROSS-REFERENCE TO RELATED APPLICATION

This application is a continuation of U.S. application Ser. No. 17/368,029 filed Jul. 6, 2021, which is based on and claims priority under 35 U.S.C. § 119 to Korean Patent Application No. 10-2020-0166969, filed on Dec. 2, 2020, in the Korean Intellectual Property Office, the disclosure of which is incorporated by reference herein in its entirety.

BACKGROUND

Inventive concepts relate to a nonvolatile memory device and a memory system including the same. More particularly, inventive concepts relates to a three-dimensional (3D) nonvolatile memory device including two structures bonded to each other and a memory system including the 3D nonvolatile memory device.

Consumers demand nonvolatile memory devices with high performance, small size, and low cost. Accordingly, a 3D nonvolatile memory device in which a plurality of memory cells are vertically arranged has been proposed to achieve a highly integrated nonvolatile memory device. In addition, a nonvolatile memory device having a reduced planar area formed by bonding a first structure to a second structure, in which the first structure is formed by forming one portion of the nonvolatile memory device on a first substrate, and the second structure is formed by forming the other portion of the nonvolatile memory device on a second substrate, has been proposed.

SUMMARY

Inventive concepts relate to a nonvolatile memory device having reduced common source line noise and/or a reduced planar area, and/or a memory system including the nonvolatile memory device.

According to an embodiment of inventive concepts, a nonvolatile memory device may include a first structure and a second structure bonded to the first structure. The first structure may include a first substrate, a peripheral circuit on the first substrate, a first insulating structure on the first substrate and the peripheral circuit, a plurality of first bonding pads on the first insulating structure, and a first interconnect structure in the first insulating structure and connected to the peripheral circuit and the plurality of first bonding pads. The second structure may include a low-resistance conductive layer, a common source line layer on the low-resistance conductive layer, a stack structure including a plurality of gate layers and a plurality of interlayer insulating layers alternately stacked above the common source line layer, a plurality of channel structures passing through a cell region of the stack structure and contacting the common source line layer, a dummy channel structure passing through a step region of the stack structure and contacting the common source line layer, a second insulating structure on the stack structure, a plurality of second bonding pads on the second insulating structure, and a second interconnect structure in the second insulating structure. The second interconnect structure may be connected to the plurality of gate layers, the plurality of channel structures, the dummy channel structure, and the plurality of second bonding pads. The plurality of second bonding pads may contact the plurality of first bonding pads, respectively. The step region of the stack structure may be on one side of the cell region of the stack structure and has a stepped shape.

According to another embodiment of inventive concepts, a nonvolatile memory device may include a first structure and a second structure bonded to the first structure. The first structure may include a first substrate, a peripheral circuit on the first substrate, a first insulating structure on the first substrate and the peripheral circuit, a plurality of first bonding pads on the first insulating structure, and a first interconnect structure in the first insulating structure and connected to the peripheral circuit and the plurality of first bonding pads. The second structure may include a low-resistance conductive layer, a common source line layer on the low-resistance conductive layer, a stack structure including a plurality of gate layers and a plurality of interlayer insulating layers alternately stacked above the common source line layer, a plurality of channel structures passing through a cell region of the stack structure and contacting the common source layer, a word line cut structure passing through the stack structure and elongated in a first direction, a dummy word line cut structure passing through the stack structure, a second insulating structure on the stack structure, a plurality of second bonding pads on the second insulating structure, and a second interconnect structure in the second insulating structure. The second interconnect structure may be connected to the plurality of gate layers, the plurality of channel structures, the dummy word line cut structure, and the plurality of second bonding pads. The dummy word line cut structure may electrically contact the common source line layer and may be elongated in the first direction. The plurality of first bonding pads may contact the plurality of second bonding pads, respectively. A step region of the stack structure may be on one side of the cell region of the stack structure and may have a stepped shape.

According to another embodiment of inventive concepts, a memory system may include a nonvolatile memory device including a first structure and a second structure bonded to the first structure and a memory controller electrically connected to the nonvolatile memory device and configured to control the nonvolatile memory device. The first structure may include a first substrate, a peripheral circuit on the first substrate, a first insulating structure on the first substrate and the peripheral circuit, a plurality of first bonding pads on the first insulating structure, and a first interconnect structure in the first insulating structure and connected to the peripheral circuit and the plurality of first bonding pads. The second structure may include a low-resistance conductive layer, a common source line layer on the low-resistance conductive layer, a stack structure including a plurality of gate layers and a plurality of interlayer insulating layers alternately stacked above the common source line layer, a plurality of channel structures passing through a cell region of the stack structure and contacting the common source line layer, a word line cut structure passing through the stack structure and being elongated in a first direction, a common source line contact passing through the stack structure and electrically contacting the common source line layer, a second insulating structure on the stack structure, a plurality of second bonding pads on the second insulating structure, an input/output pad connected to the memory controller, and a second interconnect structure in the second insulating structure. The second interconnect structure may be connected to the plurality of gate layers, the plurality of channel structures, the common source line contact, the input/output pad, and the plurality of second bonding pads. The plurality of first bonding pads may contact the plurality of second bonding pads, respectively. A step region of the stack structure may be on one side of the cell region of the stack structure and may have a stepped shape.

BRIEF DESCRIPTION OF THE DRAWINGS

Embodiments of inventive concepts will be more clearly understood from the following detailed description taken in conjunction with the accompanying drawings in which:

FIGS. 3A to 3M are cross-sectional views for describing a method of manufacturing a nonvolatile memory device, according to embodiments of inventive concepts;

FIGS. 4A to 4J are cross-sectional views for describing a method of manufacturing a nonvolatile memory device, according to embodiments of inventive concepts;

FIG. 7 is a schematic cross-sectional view of semiconductor packages according to embodiments of inventive concepts.

DETAILED DESCRIPTION

Figure 1A:
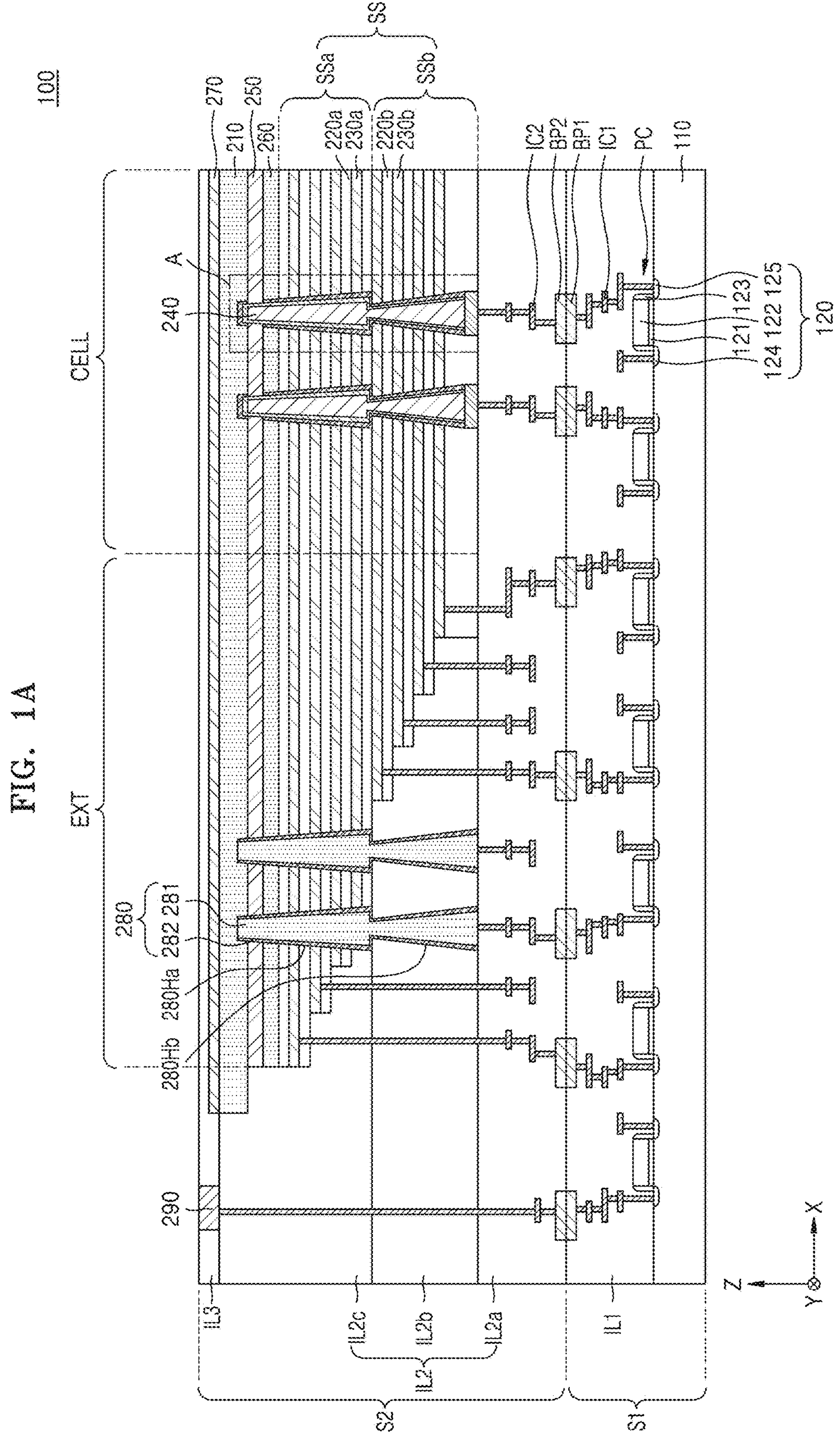
FIG. 1A is a cross-sectional view of a nonvolatile memory device according to embodiments of inventive concepts.
Figure 1B:
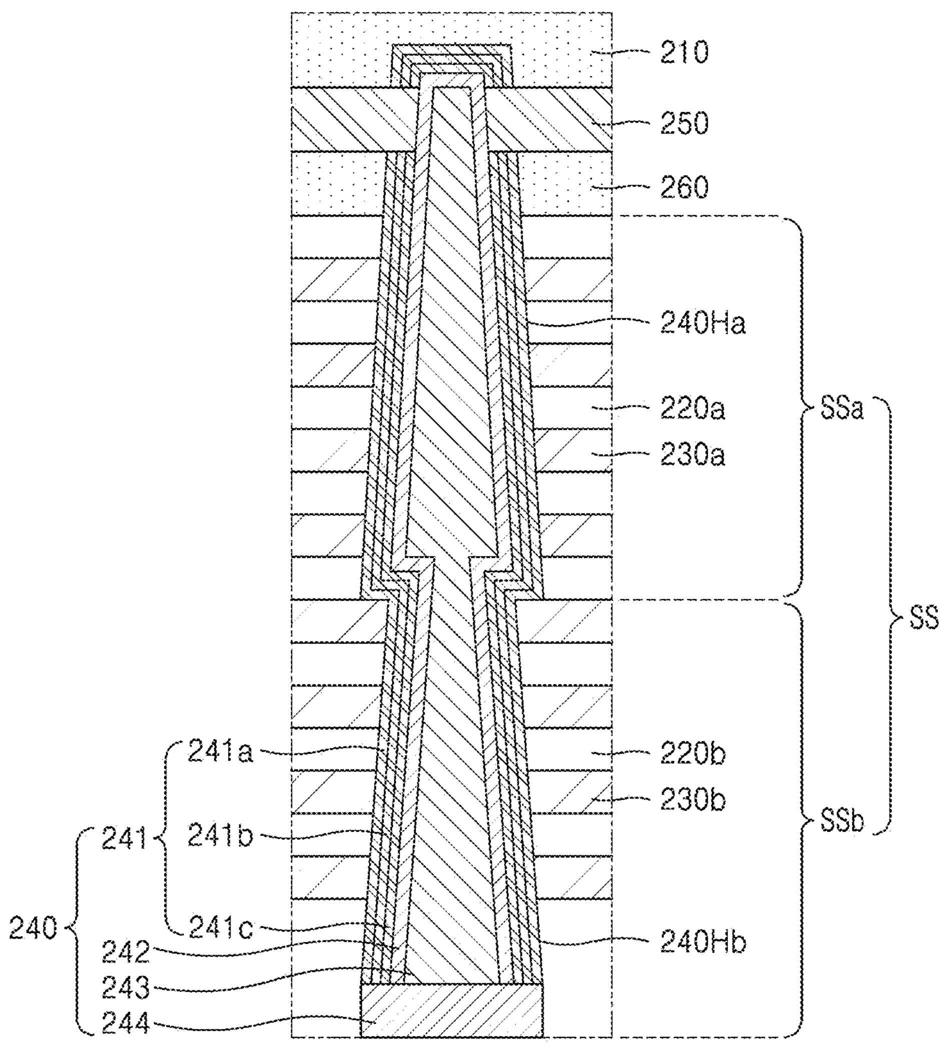
FIG. 1B is an enlarged view of region A of FIG. 1A.

FIG. 1A is a cross-sectional view of a nonvolatile memory device 100 according to embodiments of inventive concepts. FIG. 1B is an enlarged view of region A of FIG. 1A.

Referring to FIGS. 1A and 1B, the nonvolatile memory device 100 includes a first structure S1 and a second structure S2 bonded to the first structure S1. The first structure S1 may contact the second structure S2 so that a plurality of first bonding pads BP1 of the first structure S1 and a plurality of second bonding pads BP2 of the second structure S2 contact each other, respectively. In some embodiments, when a first bonding pad BP1 includes copper (Cu) and a second bonding pad BP2 includes copper (Cu), the first structure S1 may be bonded to the second structure S2 by Cu—Cu bonding.

The first structure S1 may include a first substrate 110, a peripheral circuit PC on the first substrate 110, a first insulating structure IL1 on the first substrate 110 and the peripheral circuit PC, the plurality of first bonding pads BP1 on the first insulating structure IL1, and a first interconnect structure IC1 in the first insulating structure IL1.

The first substrate 110 may include a semiconductor material such as a Group IV semiconductor material, a Group III-V semiconductor material, or a Group II-VI semiconductor material. The Group IV semiconductor material may include, for example, silicon (Si), germanium (Ge), or silicon germanium (SiGe). The Group III-V semiconductor material may include, for example, gallium arsenide (GaAs), indium phosphide (InP), gallium phosphide (GaP), indium arsenide (InAs), indium antimonide (InSb), or indium gallium arsenide (InGaAs). The Group II-VI semiconductor material may include, for example, zinc telluride (ZnTe) or cadmium sulfide (CdS). The first substrate 110 may be a bulk wafer or an epitaxial layer.

The peripheral circuit PC may be arranged on the first substrate 110. The peripheral circuit PC may include a plurality of transistors 120. For example, a transistor 120 may include a gate electrode 122 above the first substrate 110, a gate insulating layer 121 between the gate electrode 122 and the first substrate 110, a gate spacer 123 on a side surface of the gate electrode 122, and a source 124 and a drain 125 on both sides of the gate electrode 122.

The first insulating structure IL1 may cover the first substrate 110 and the peripheral circuit PC. Although not shown in FIG. 1A, the first insulating structure IL1 may include a plurality of insulating layers stacked on each other. The first insulating structure IL1 may include, for example, an insulating material which may include silicon oxide, silicon nitride, a low dielectric (low-k) material, or a combination thereof. The low dielectric material is a material having a dielectric constant lower than that of silicon oxide and may include, for example, phosphosilicate glass (PSG), borophosphosilicate glass (BPSG), fluorosilicate glass (FSG), organosilicate glass (OSG), spin-on-glass (SOG), spin-on-polymer, or a combination thereof.

The first bonding pad BP1 may be arranged on the first insulating structure IL1. In some embodiments, an upper surface of the first bonding pad BP1 may be coplanar with an upper surface of the first insulating structure IL1. That is, the first bonding pad BP1 may not protrude from an upper surface of the first insulating structure ILL. The first bonding pad BP1 may include a conductive material which may include copper (Cu), gold (Au), silver (Ag), aluminum (Al), tungsten (W), titanium (Ti), tantalum (Ta), or a combination thereof.

The first interconnect structure IC1 may be arranged in the first insulating structure IL1. The first interconnect structure IC1 may be connected to the peripheral circuit PC and the plurality of first bonding pads BP1. The first interconnect structure IC1 may connect the peripheral circuit PC to the plurality of first bonding pads BP1. The first interconnect structure IC1 may further connect the plurality of transistors 120 in the peripheral circuit PC. The first interconnect structure IC1 may include a plurality of lines, vias connecting the plurality of lines to each other, and plugs connecting the plurality of lines and the plurality of transistors 120 to each other. The first interconnect structure IC1 may include a conductive material such as copper (Cu), aluminum (Al), tungsten (W), silver (Ag), gold (Au), or a combination thereof.

The second structure S2 may include a low-resistance conductive layer 270, a common source line layer 210 on the low-resistance conductive layer 270, a stack structure SS above the common source line layer 210, a plurality of channel structures 240 passing through a cell region CELL of the stack structure SS, a plurality of dummy channel structures 280 passing through a step region EXT of the stack structure SS, a second insulating structure IL2 on the stack structure SS, the plurality of second bonding pads BP2 on the second insulating structure IL2, and a second interconnect structure IC2 in the second insulating structure IL2.

In some embodiments, the second structure S2 may further include a lower conductive layer 250 between the common source line layer 210 and the stack structure SS. In some embodiments, the second structure S2 may further include a lower support layer 260 between the lower conductive layer 250 and the stack structure SS. In some embodiments, the second structure S2 may further include a third insulating structure IL3 on the second insulating structure IL2 and the low-resistance conductive layer 270 and an input/output pad 290 passing through the third insulating structure IL3.

The common source line layer 210 may include, for example, a semiconductor material such as a Group IV semiconductor material, a Group III-V semiconductor material, or a Group II-VI semiconductor material. The common source line layer 210 may include, for example, polysilicon. The low-resistance conductive layer 270 may contact the common source line layer 210 and serve as a portion of a common source line. A material constituting the low-resistance conductive layer 270 may have lower resistivity than a material constituting the common source line layer 210. For example, while the common source line layer 210 includes polysilicon, the low-resistance conductive layer 270 may include metal. The metal may include, for example, copper (Cu), aluminum (Al), tungsten (W), silver (Ag), gold (Au), or a combination thereof. The low-resistance conductive layer 270 may reduce common source line noise by reducing a net resistance of the common source line.

The stack structure SS may be arranged above the common source line layer 210. The stack structure SS may include a plurality of gate layers, for example, a plurality of first and second gate layers 230*a* and 230*b*, and a plurality of interlayer insulating layers, for example, a plurality of first and second interlayer insulating layers 220*a* and 220*b*, alternately stacked above the common source line layer 210. The stack structure SS may include a first portion SSa above the common source line layer 210 and a second portion SSb on the first portion SSa. The first portion SSa of the stack structure SS may include a plurality of first gate layers 230*a* and a plurality of first interlayer insulating layers 220*a* alternately stacked above the common source line layer 210. The second portion SSb of the stack structure SS may include a plurality of second gate layers 230*b* and a plurality of second interlayer insulating layers 220*b* alternately stacked on the first portion SSa of the stack structure SS.

The stack structure SS may include the cell region CELL and the step region EXT. The step region EXT of the stack structure SS may be on one side of the cell region CELL of the stack structure SS and may have a stepped shape. For example, the step region EXT of the stack structure SS may have a stepped shape descending in a direction +Z.

The plurality of gate layers, for example, the plurality of first and second gate layers 230*a* and 230*b*, may include tungsten (W), copper (Cu), silver (Ag), gold (Au), aluminum (Al), or a combination thereof but is not limited thereto. The plurality of interlayer insulating layers, for example, the plurality of first and second interlayer insulating layers 220*a* and 220*b*, may include an insulating material which may include silicon oxide, silicon nitride, a low dielectric material, or a combination thereof.

Each of the plurality of channel structures 240 may pass through the cell region CELL of the stack structure SS and contact the common source line layer 210. In some embodiments, a channel structure 240 may further pass through the lower conductive layer 250 and the lower support layer 260.

Referring to FIG. 1B, the channel structure 240 may be in a first channel hole 240Ha and a second channel hole 240Hb. The channel structure 240 may include a gate insulating layer 241 on the first channel hole 240Ha and the second channel hole 240Hb and a channel layer 242 on the gate insulating layer 241. In some embodiments, the channel structure 240 may include a buried insulating layer 243 on the channel layer 242 and a channel pad 244 in an end portion of the second channel hole 240Hb.

The gate insulating layer 241 may extend between the common source line layer 210 and the channel layer 242 and between the stack structure SS and the channel layer 242. The gate insulating layer 241 may include a blocking insulating layer 241*a*, a charge storage layer 241*b*, and a tunneling insulating layer 241*c* sequentially stacked on the first channel hole 240Ha and the second channel hole 240Hb. The blocking insulating layer 241*a* may include, for example, silicon oxide, silicon nitride, metal oxide having a dielectric constant higher than that of silicon oxide, or a combination thereof. The metal oxide may include, for example, hafnium oxide, aluminum oxide, zirconium oxide, tantalum oxide, or a combination thereof. The charge storage layer 241*b* may include, for example, silicon nitride, boron nitride, polysilicon, or a combination thereof. The tunneling insulating layer 241*c* may include, for example, metal oxide or silicon oxide. In some embodiments, the blocking insulating layer 241*a*, the charge storage layer 241*b*, and the tunneling insulating layer 241*c* may include oxide, nitride, and oxide, respectively.

The channel layer 242 may surround side surfaces and one end of the buried insulating layer 243. The channel layer 242 may include a semiconductor material such as a Group IV semiconductor material, a Group III-V semiconductor material, or a Group II-VI semiconductor material. In some embodiments, the channel layer 242 may include polysilicon.

The buried insulating layer 243 may fill a space surrounded by the channel layer 242 and the channel pad 244. The buried insulating layer 243 may include, for example, an insulating material which may include silicon nitride, silicon oxide, a low dielectric material, or a combination thereof. In some embodiments, the buried insulating layer 243 may include silicon oxide.

The channel pad 244 may contact the channel layer 242 and the buried insulating layer 243. In some embodiments, the channel pad 244 may further contact the gate insulating layer 241. The channel pad 244 may include a conductive material such as a semiconductor material such as silicon (Si), germanium (Ge), or silicon germanium (SiGe), a metal material such as tungsten (W), titanium (Ti), aluminum (Al), copper (Cu), gold (Au), or silver (Ag), metal nitride such as titanium nitride (TiN) or tantalum nitride (TaN), or a combination thereof. In some embodiments, the channel pad 244 may include polysilicon.

Referring to FIG. 1A again, the plurality of dummy channel structures 280 may pass through the step region EXT of the stack structure SS and contact the common source line layer 210. A dummy channel structure 280 may further pass through the lower conductive layer 250 and the lower support layer 260. The dummy channel structure 280 may further pass through a second portion IL2*b* and a third portion IL2*c* of the second insulating structure IL2. The dummy channel structure 280 may be in a first dummy channel hole 280Ha passing through the step region EXT of the stack structure SS and the third portion IL2*c* of the second insulating structure IL2 and a second dummy channel hole 280Hb passing through the second portion IL2*b* of the second insulating structure IL2.

The dummy channel structure 280 may include an insulating layer 282 on the first dummy channel hole 280Ha and the second dummy channel hole 280Hb and a conductive layer 281 on the insulating layer 282. The conductive layer 281 may extend in the first dummy channel hole 280Ha and the second dummy channel hole 280Hb and contact the common source line layer 210. The insulating layer 282 may extend between the conductive layer 281 and the step region EXT of the stack structure SS. The insulating layer 282 may further extend between the conductive layer 281 and the second portion IL2*b* of the second insulating structure IL2. The insulating layer 282 may further extend between the conductive layer 281 and the third portion IL2*c* of the second insulating structure IL2. In some embodiments, the insulating layer 282 may further extend between the conductive layer 281 and the lower support layer 260. In some embodiments, the insulating layer 282 may further extend between the conductive layer 281 and the lower conductive layer 250.

The conductive layer 281 may include a conductive material such as a semiconductor material or a metal material. The conductive layer 281 may include, for example, polysilicon, copper (Cu), tungsten (W), aluminum (Al), gold (Au), silver (Ag), or a combination thereof. The insulating layer 282 may include, for example, silicon oxide, silicon nitride, a low dielectric material, or a combination thereof.

The dummy channel structure 280 passing through the step region EXT of the stack structure SS may serve as a common source line contact for contacting the common source line layer 210. Because a planar area occupied by a common source line contact contacting the common source line layer 210 from outside the stack structure SS is not required, a planar area of the nonvolatile memory device 100 may be reduced.

The second insulating structure IL2 may cover the stack structure SS, the plurality of channel structures 240, and the plurality of dummy channel structures 280. The second insulating structure IL2 may include a plurality of insulating layers. For example, the second insulating structure IL2 may include a first portion IL2*a*, the second portion IL2*b* on the first portion IL2*a*, and the third portion IL2*c* on the second portion IL2*b*. The second insulating structure IL2 may include, for example, an insulating material which may include silicon oxide, silicon nitride, a low dielectric material, or a combination thereof.

The plurality of second bonding pads BP2 may be arranged on the second insulating structure IL2. In some embodiments, an upper surface of the second bonding pad BP2 may be coplanar with a lower surface of the second insulating structure IL2. That is, the second bonding pad BP2 may not protrude from a lower surface of the second insulating structure IL2. The second bonding pad BP2 may include a conductive material which may include copper (Cu), gold (Au), silver (Ag), aluminum (Al), tungsten (W), titanium (Ti), tantalum (Ta), or a combination thereof.

The second interconnect structure IC2 may be arranged in the second insulating structure IL2 and may be connected to the plurality of gate layers, for example, the plurality of first and second gate layers 230*a* and 230*b*, the plurality of channel structures 240, the dummy channel structure 280, and the plurality of second bonding pads BP2. For example, the second interconnect structure IC2 may connect the plurality of gate layers, for example, the plurality of first and second gate layers 230*a* and 230*b*, the plurality of channel structures 240, and the dummy channel structure 280 to the plurality of second bonding pads BP2. In some embodiments, the second interconnect structure IC2 may be further connected to the input/output pad 290. For example, the second interconnect structure IC2 may connect the input/output pad 290 to the second bonding pad BP2.

The plurality of gate layers, for example, the plurality of first and second gate layers 230*a* and 230*b*, may be connected to the peripheral circuit PC through the second interconnect structure IC2, the plurality of second bonding pads BP2, the plurality of first bonding pads BP1, and the first interconnect structure IC1. In addition, the plurality of channel structures 240 may be connected to the peripheral circuit PC through the second interconnect structure IC2, the plurality of second bonding pads BP2, the plurality of first bonding pads BP1, and the first interconnect structure IC1. In addition, the dummy channel structure 280 may be connected to the peripheral circuit PC through the second interconnect structure IC2, the second bonding pad BP2, the first bonding pad BP1, and the first interconnect structure IC1. In addition, the input/output pad 290 may be connected to the peripheral circuit PC through the second interconnect structure IC2, the second bonding pad BP2, the first bonding pad BP1, and the first interconnect structure IC1.

The second interconnect structure IC2 may include a plurality of lines, vias connecting the plurality of lines to each other, and a plurality of plugs contacting the plurality of gate layers, for example, the plurality of first and second gate layers 230*a* and 230*b*, the plurality of channel structures 240, the dummy channel structure 280, and the input/output pad 290. The second interconnect structure IC2 may include a conductive material such as copper (Cu), aluminum (Al), tungsten (W), silver (Ag), gold (Au), or a combination thereof.

The lower conductive layer 250 may extend between the lower support layer 260 and the common source line layer 210. The lower conductive layer 250 may include a conductive material such as a semiconductor material or a metal material. The lower conductive layer 250 may include polysilicon, aluminum (Al), tungsten (W), silver (Ag), gold (Au), or a combination thereof. In some embodiments, as shown in FIG. 1B, the lower conductive layer 250 may pass through the gate insulating layer 241 and contact the channel layer 242.

The lower support layer 260 may extend between the stack structure SS and the lower conductive layer 250. The lower support layer 260 may include a conductive material such as a semiconductor material or a metal material. The lower support layer 260 may include polysilicon, aluminum (Al), tungsten (W), silver (Ag), gold (Au), or a combination thereof. In some embodiments, the common source line layer 210, the lower conductive layer 250, and the lower support layer 260 may include polysilicon, and thus, a boundary between the common source line layer 210 and the lower conductive layer 250 and a boundary between the lower conductive layer 250 and the lower support layer 260 may be unclear or unidentifiable.

The third insulating structure IL3 may be arranged on the second insulating structure IL2 and the low-resistance conductive layer 270. Although not shown in FIG. 1A, the third insulating structure IL3 may include a plurality of insulating layers stacked on each other. The third insulating structure IL3 may include an insulating material such as silicon oxide, silicon nitride, a low dielectric material, or a combination thereof.

The input/output pad 290 may pass through the third insulating structure IL3. The input/output pad 290 may be exposed to the outside of the nonvolatile memory device 100. As will be described with reference to FIGS. 5 and 6, the input/output pad 290 may be connected to a memory controller (not shown) outside the nonvolatile memory device 100. The input/output pad 290 may include a conductive material such as copper (Cu), aluminum (Al), tungsten (W), silver (Ag), or gold (Au).

Figure 2A:
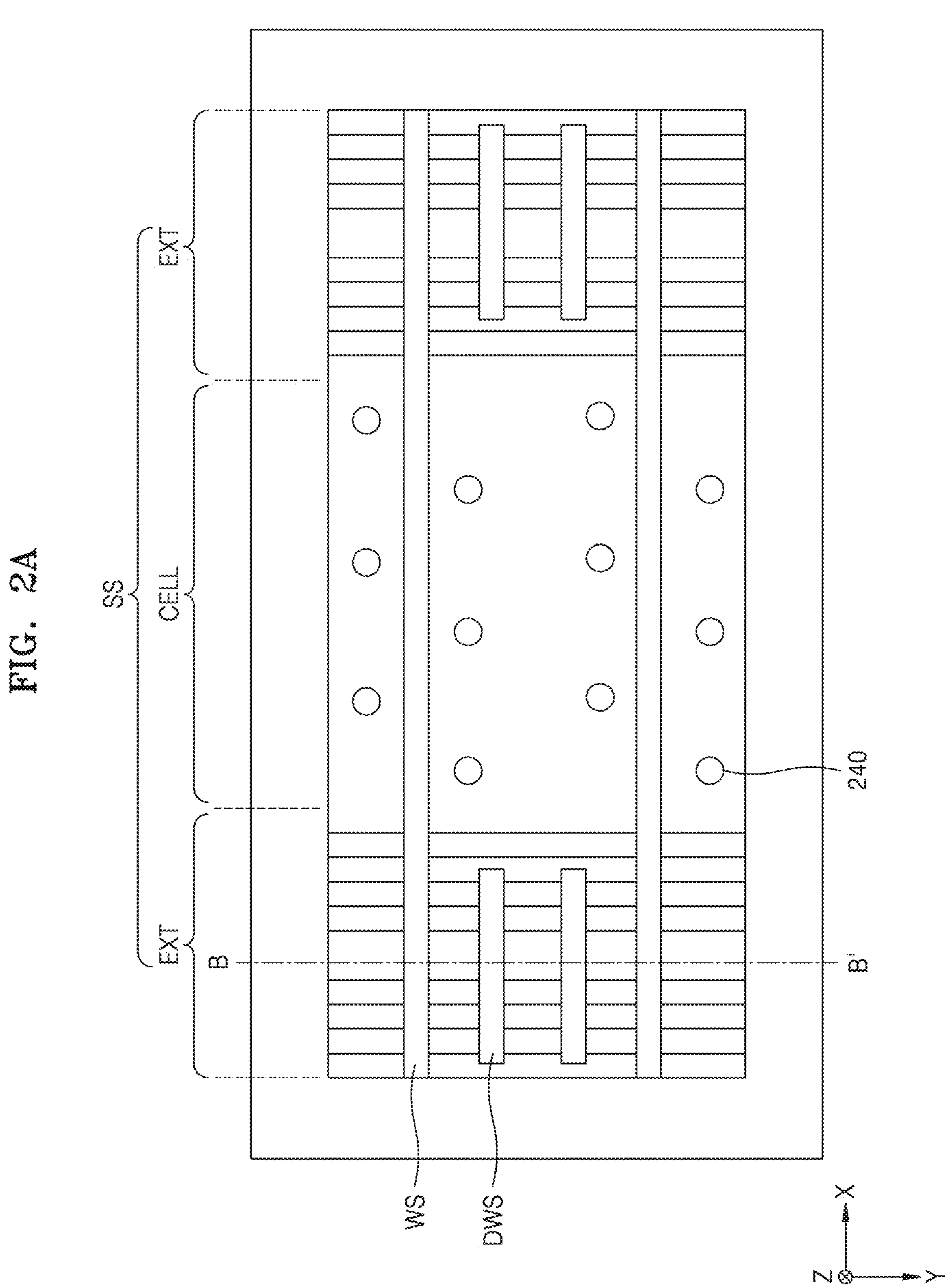
FIG. 2A is a bottom view of a nonvolatile memory device according to embodiments of inventive concepts.
Figure 2B:
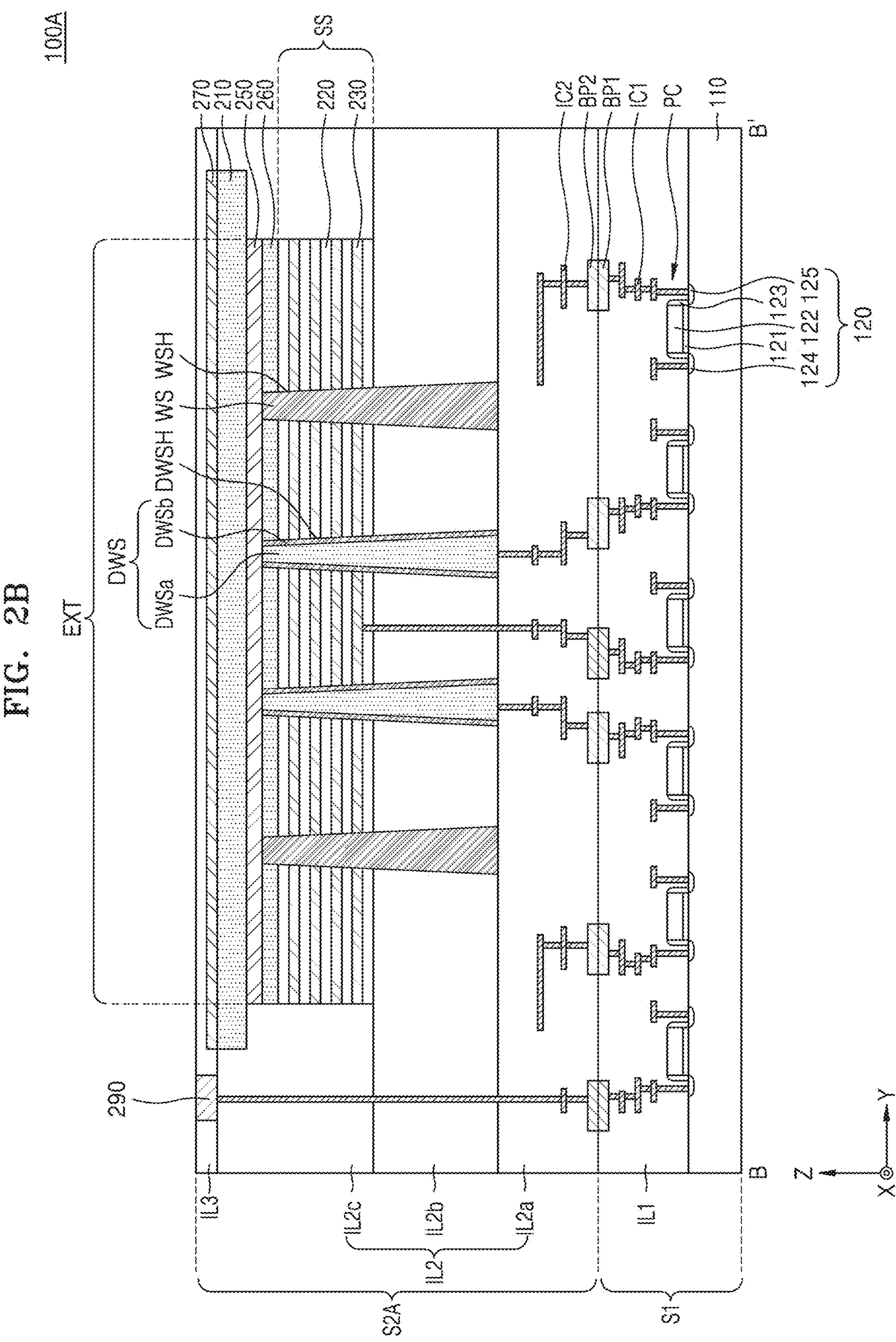
FIG. 2B is a cross-sectional view of the nonvolatile memory device, taken along line B-B' of FIG. 2A.

FIG. 2A is a bottom view of a nonvolatile memory device 100A according to embodiments of inventive concepts. FIG. 2B is a cross-sectional view of the nonvolatile memory device 100A, taken along line B-B' of FIG. 2A. Hereinafter, differences between the nonvolatile memory device 100 described with reference to FIGS. 1A and 1B and the nonvolatile memory device 100A to be described with reference to FIGS. 2A and 2B will be described.

Referring to FIGS. 2A and 2B, similar to the nonvolatile memory device 100 described with reference to FIGS. 1A and 1B, the nonvolatile memory device 100A may include the first structure S1 and a second structure S2A bonded to the first structure S1. The first structure S1 is the same as described with reference to FIG. 1A. The second structure S2A may further include a word line cut structure WS and a dummy word line cut structure DWS. Although not shown in FIGS. 2A and 2B, the second structure S2A may include the dummy channel structure 280 shown in FIG. 1A, may not include the dummy channel structure 280, or may include the dummy channel structure 280 having the same configuration as the channel structure 240.

The word line cut structure WS may pass through the stack structure SS and may be elongated in a first horizontal direction (a direction X). The word line cut structure WS may pass through the step region EXT and the cell region CELL of the stack structure SS in the first horizontal direction (the direction X). The word line cut structure WS may further pass through the second portion IL2*b* of the second insulating structure IL2 and the lower support layer 260. The word line cut structure WS may be in a word line cut WSH passing through the stack structure SS. The word line cut WSH may further pass through the second portion IL2*b* of the second insulating structure IL2 and the lower support layer 260. The word line cut structure WS may include, for example, an insulating material including silicon oxide, silicon nitride, a low dielectric material, or a combination thereof.

The dummy word line cut structure DWS may pass through the step region EXT of the stack structure SS in a vertical direction (a direction Z) and be elongated in the first horizontal direction (the direction X). The dummy word line cut structure DWS may be in the step region EXT of the stack structure SS and may not pass through the cell region CELL of the stack structure SS. The dummy word line cut structure DWS may further pass through the second portion IL2*b* of the second insulating structure IL2 and the lower support layer 260. The dummy word line cut structure DWS may be in a dummy word line cut DWSH passing through the step region EXT of the stack structure SS. The dummy word line cut DWSH may further pass through the second portion IL2*b* of the second insulating structure IL2 and the lower support layer 260.

In some embodiments, the dummy word line cut structure DWS may not directly contact the common source line layer 210 but may be brought into electrical contact with the common source line layer 210 through the lower conductive layer 250. In another embodiment, the dummy word line cut structure DWS may pass through the lower conductive layer 250 and come into direct contact with the common source line layer 210.

The dummy word line cut structure DWS may include a conductive layer DWSa contacting the common source line layer 210 and an insulating layer DWSb between the conductive layer DWSa and the stack structure SS. In some embodiments, the conductive layer DWSa in contact may not directly contact the common source line layer 210 but may be brought into electrical contact with the common source line layer 210 through the lower conductive layer 250. The insulating layer DWSb may further extend between the conductive layer DWSa and the second portion IL2*b* of the second insulating structure IL2. In addition, the insulating layer DWSb may further extend between the conductive layer DWSa and the lower support layer 260. In other words, the insulating layer DWSb may be arranged on the dummy word line cut DWSH.

The conductive layer DWSa may include, for example, polysilicon, copper (Cu), tungsten (W), aluminum (Al), gold (Au), silver (Ag), or a combination thereof. The insulating layer DWSb may include, for example, silicon oxide, silicon nitride, a low dielectric material, or a combination thereof.

The second interconnect structure IC2 may be further connected to the dummy word line cut structure DWS. For example, the dummy word line cut structure DWS may be connected to the peripheral circuit PC through the second interconnect structure IC2, the second bonding pad BP2, the first bonding pad BP1, and the first interconnect structure IC1. However, the second interconnect structure IC2 may not be connected to the word line cut structure WS.

According to embodiments of inventive concepts, the dummy word line cut structure DWS passing through the step region EXT of the stack structure SS may be used as a contact for the common source line layer 210. Because a planar area occupied by a common source line contact contacting the common source line layer 210 from outside the stack structure SS is not required, a planar area of the nonvolatile memory device 100A may be reduced.

FIGS. 3A to 3M are cross-sectional views for describing a method of manufacturing the nonvolatile memory device 100 (refer to FIG. 1A), according to embodiments of inventive concepts.

Figure 3A:
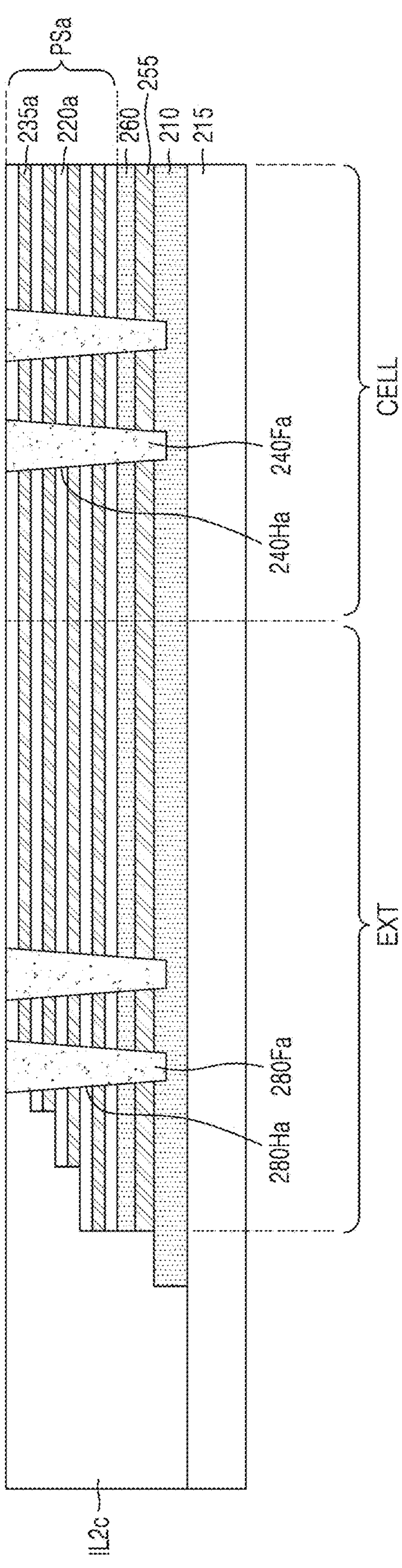

Referring to FIG. 3A, a second substrate 215 may be provided. The second substrate 215 may include, for example, a semiconductor material such as a Group IV semiconductor material, a Group III-V semiconductor material, or a Group II-VI semiconductor material. The common source line layer 210 may be formed on the second substrate 215. A first portion PSa of a preliminary stack structure may be formed above the common source line layer 210. The first portion PSa of the preliminary stack structure may be formed by alternately forming the plurality of first interlayer insulating layers 220*a* and a plurality of first sacrificial layers 235*a* above the common source line layer 210. Each of the plurality of first sacrificial layers 235*a* may include a material having an etch selectivity with respect to each of the plurality of first interlayer insulating layers 220*a*. For example, when a first interlayer insulating layer 220*a* includes silicon oxide, a first sacrificial layer 235*a* may include silicon nitride.

In some embodiments, a lower sacrificial layer 255 may be further formed between the common source line layer 210 and the first portion PSa of the preliminary stack structure. In some embodiments, the lower support layer 260 may be further formed between the lower sacrificial layer 255 and the first portion PSa of the preliminary stack structure. The lower sacrificial layer 255 may include a material having an etch selectivity with respect to the common source line layer 210 and the lower support layer 260. For example, when the common source line layer 210 and the lower support layer 260 include polysilicon, the lower sacrificial layer 255 may include silicon nitride.

The first portion PSa of preliminary stack structure may be patterned so that the step region EXT of the first portion PSa of the preliminary stack structure has a stepped shape. Next, the third portion IL2*c* of a second insulating structure may be formed on the second substrate 215 and the first portion PSa of the preliminary stack structure. Next, the first channel hole 240Ha passing through the cell region CELL of the first portion PSa of the preliminary stack structure and the first dummy channel hole 280Ha passing through the step region EXT of the first portion PSa of the preliminary stack structure may be formed. The first dummy channel hole 280Ha may further pass through the third portion IL2*c* of the second insulating structure. The first channel hole 240Ha and the first dummy channel hole 280Ha may further pass through the lower support layer 260 and the lower sacrificial layer 255.

Next, the first channel hole 240Ha and the first dummy channel hole 280Ha are filled by a first filling layer 240Fa and a first dummy filling layer 280Fa, respectively. In some embodiments, the first filling layer 240Fa and the first dummy filling layer 280Fa may include polysilicon.

Figure 3B:
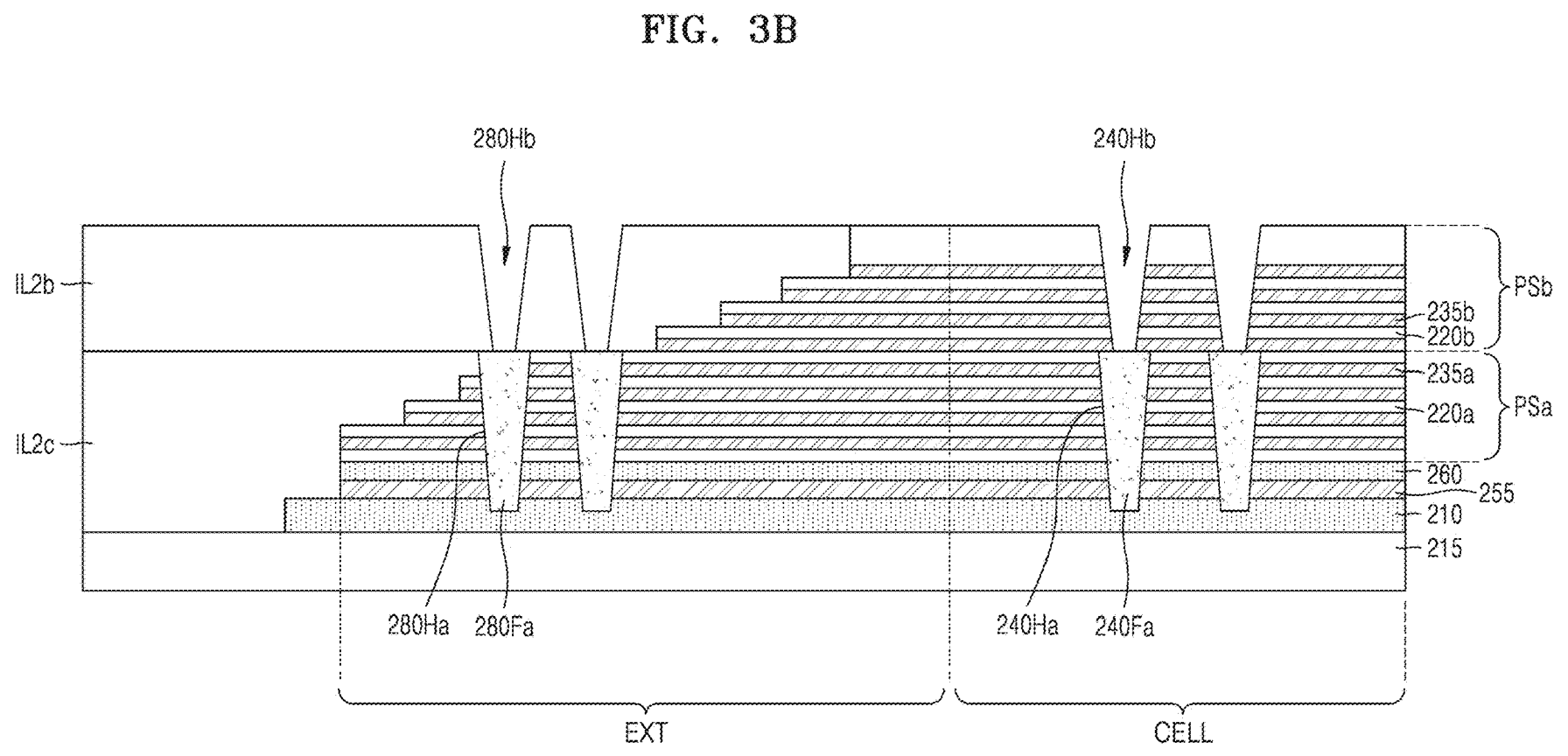

Referring to FIG. 3B, a second portion PSb of the preliminary stack structure may be formed on the first portion PSa of the preliminary stack structure. The second portion PSb of the preliminary stack structure may be formed by alternately forming the plurality of second interlayer insulating layers 220*b* and a plurality of second sacrificial layers 235*b* on the first portion PSa of the preliminary stack structure. Each of the plurality of second sacrificial layers 235*b* may include a material having an etch selectivity with respect to each of the plurality of second interlayer insulating layers 220*b*. For example, when a second interlayer insulating layer 220*b* includes silicon oxide, a second sacrificial layer 235*b* may include silicon nitride.

Next, the second portion PSb of the preliminary stack structure may be patterned so that the step region EXT of the second portion PSb of the preliminary stack structure has a stepped shape. Next, the second portion IL2*b* of the second insulating structure may be formed on the third portion IL2*c* of the second insulating structure and the first portion PSa and the second portion PSb of the preliminary stack structure. Next, the second channel hole 240Hb passing through the second portion PSb of the preliminary stack structure and exposing the first filling layer 240Fa and the second dummy channel hole 280Hb passing through the second portion IL2*b* of the second insulating structure and exposing the first dummy filling layer 280Fa may be formed.

Figure 3C:
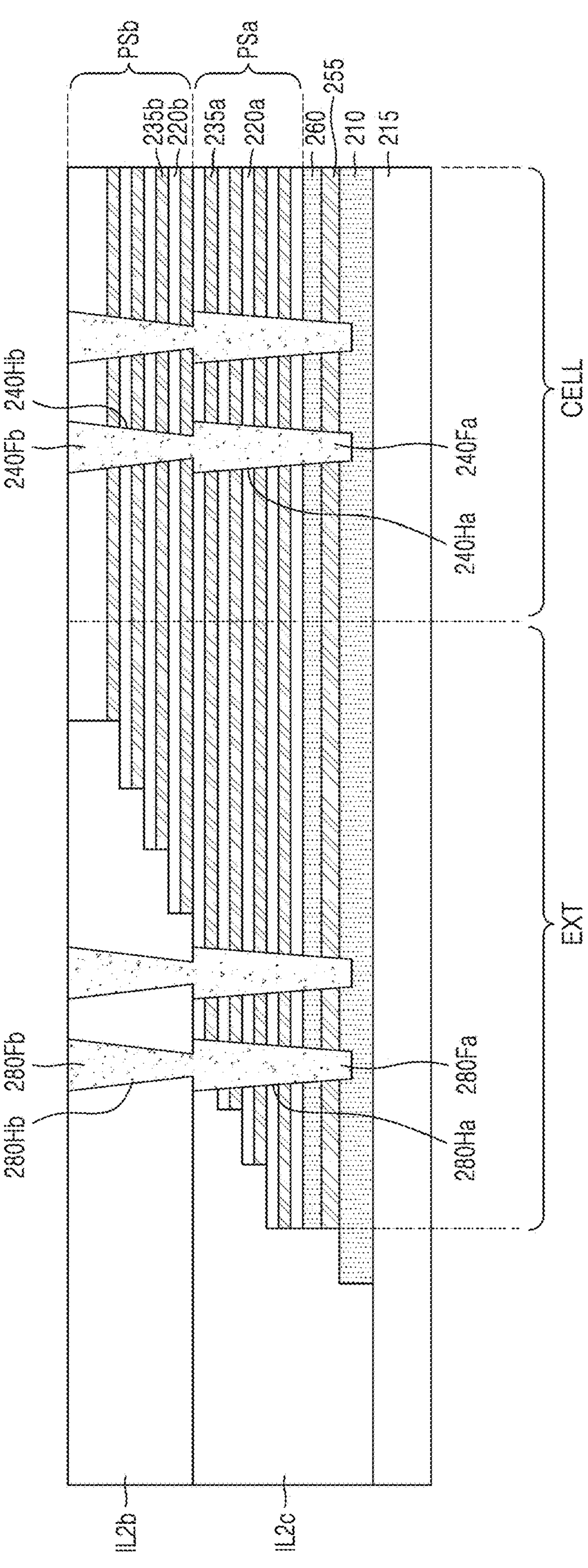

Referring to FIG. 3C, the second channel hole 240Hb and the second dummy channel hole 280Hb may be filled by a second filling layer 240Fb and a second dummy filling layer 280Fb, respectively. In some embodiments, the second filling layer 240Fb and the second dummy filling layer 280Fb may include polysilicon.

Figure 3D:
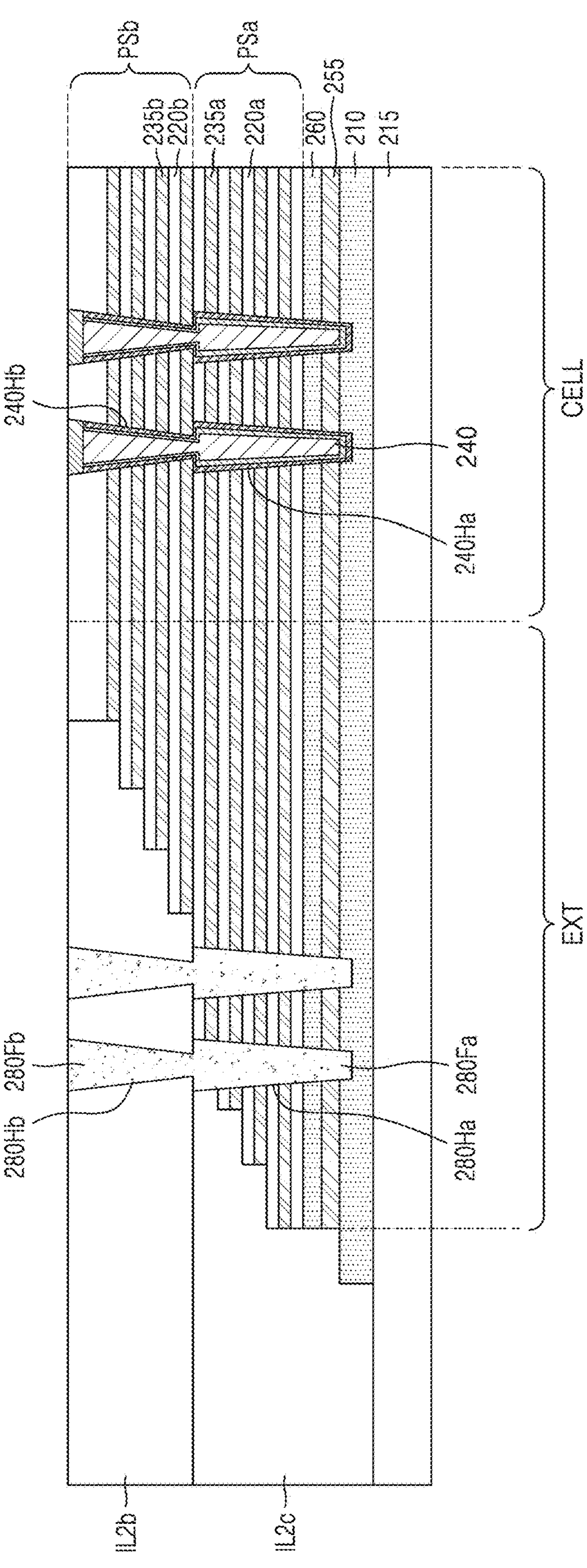

Referring to FIGS. 3C and 3D, the first filling layer 240Fa and the second filling layer 240Fb may be respectively removed from the first channel hole 240Ha and the second channel hole 240Hb. To limit and/or prevent the first dummy filling layer 280Fa and the second dummy filling layer 280Fb from being removed, a mask for covering the second dummy filling layer 280Fb and exposing the second filling layer 240Fb may be formed before the first filling layer 240Fa and the second filling layer 240Fb are removed. The mask may be removed after the first filling layer 240Fa and the second filling layer 240Fb are removed.

Next, the channel structure 240 may be formed in the first channel hole 240Ha and the second channel hole 240Hb. Referring to FIGS. 3D and 1B, the gate insulating layer 241 may be formed on the first channel hole 240Ha and the second channel hole 240Hb. For example, the gate insulating layer 241 may be formed by sequentially forming the blocking insulating layer 241*a*, the charge storage layer 241*b*, and the tunneling insulating layer 241*c* on the first channel hole 240Ha and the second channel hole 240Hb. The channel layer 242 may be formed on the gate insulating layer 241. The buried insulating layer 243 may be formed on the channel layer 242. The buried insulating layer 243 may fill the first channel hole 240Ha and the second channel hole 240Hb together with the gate insulating layer 241 and the channel layer 242. Next, portions of the gate insulating layer 241, the channel layer 242, and the buried insulating layer 243 in an end portion of the second channel hole 240Hb may be removed, and the channel pad 244 may be formed in the end portion of the second channel hole 240Hb.

Figure 3E:
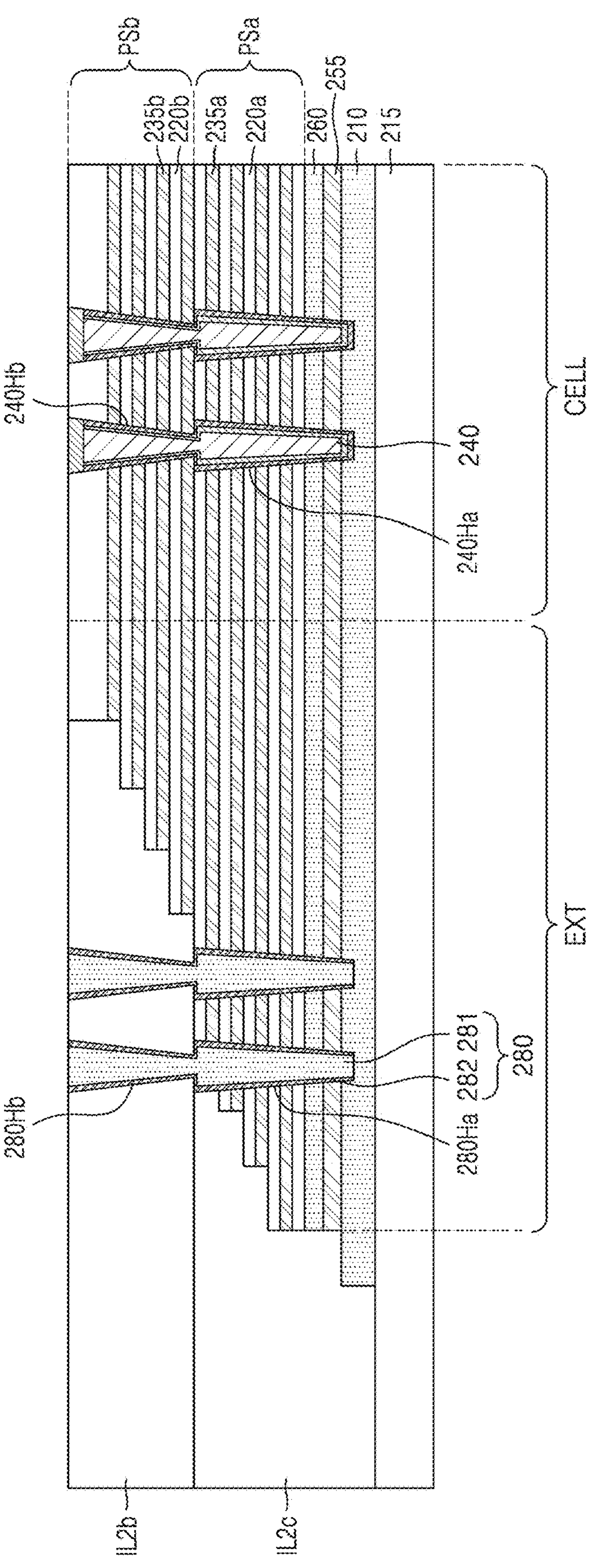

Referring to FIGS. 3D and 3E, the first dummy filling layer 280Fa and the second dummy filling layer 280Fb may be respectively removed from the first dummy channel hole 280Ha and the second dummy channel hole 280Hb. In some embodiments, to limit and/or prevent the channel structure 240 from being removed, a mask for covering the channel structure 240 and exposing the second dummy filling layer 280Fb may be formed before the first dummy filling layer 280Fa and the second dummy filling layer 280Fb are removed. The mask may be removed after the first dummy filling layer 280Fa and the second dummy filling layer 280Fb are removed.

Next, the dummy channel structure 280 may be formed in the first dummy channel hole 280Ha and the second dummy channel hole 280Hb. First, the insulating layer 282 may be formed on sidewalls of the first dummy channel hole 280Ha and the second dummy channel hole 280Hb. For example, the insulating layer 282 may be formed on an upper surface of the second portion IL2*b* of the second insulating structure, sidewalls of the second dummy channel hole 280Hb, and sidewalls and the bottom of the first dummy channel hole 280Ha, and the insulating layer 282 on the upper surface of the second portion IL2*b* of the second insulating structure and the bottom of the first dummy channel hole 280Ha may be removed by anisotropically etching the insulating layer 282. Next, the conductive layer 281 may be formed on the insulating layer 282. The conductive layer 281 may fill the first dummy channel hole 280Ha and the second dummy channel hole 280Hb together with the insulating layer 282.

Figure 3F:
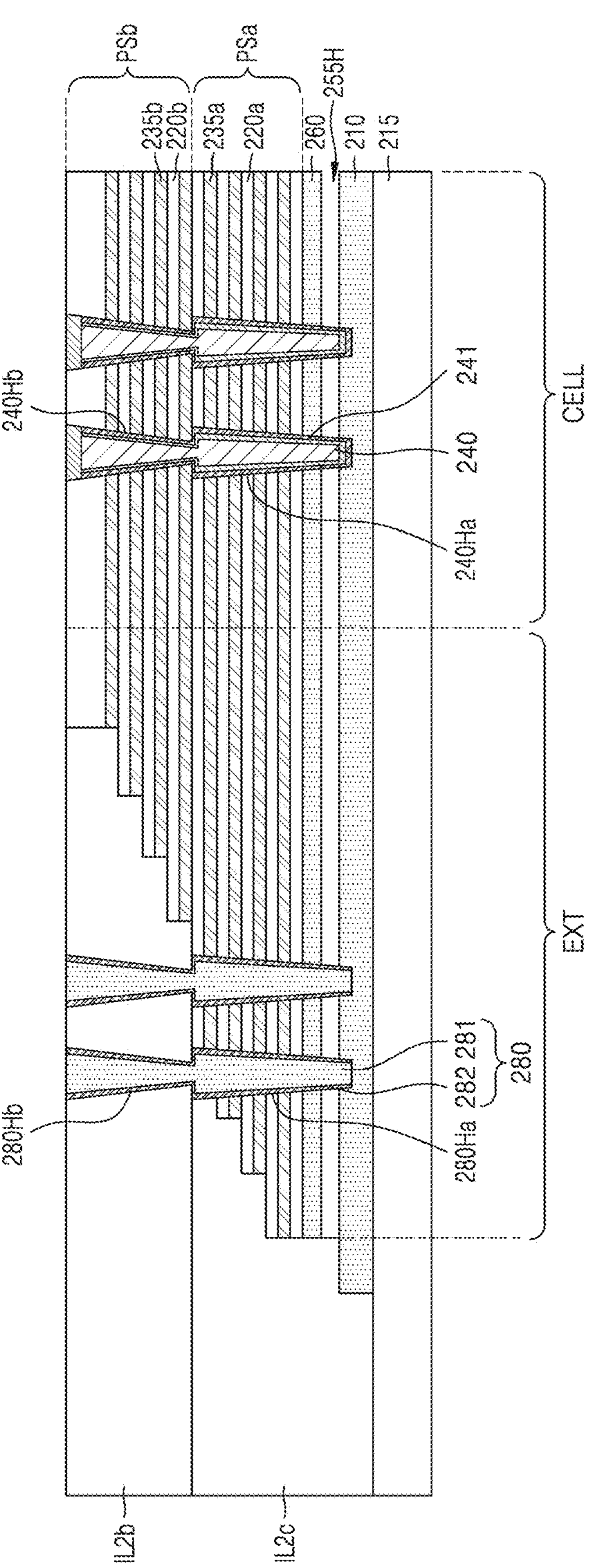

Referring to FIGS. 3E and 3F, a space 255H may be formed between the common source line layer 210 and the lower support layer 260 by removing the lower sacrificial layer 255. The gate insulating layer 241 of the channel structure 240 and the insulating layer 282 of the dummy channel structure 280 may be exposed in the space 255H. To remove the lower sacrificial layer 255, although not shown in FIGS. 3E and 3F, a word line cut passing through the preliminary stack structure, for example, the first and second portions PSa and PSb, and the lower support layer 260 and exposing the lower sacrificial layer 255 may be formed before the lower sacrificial layer 255 is removed. An etchant may reach the lower sacrificial layer 255 through the word line cut and etch the lower sacrificial layer 255.

Figure 3G:
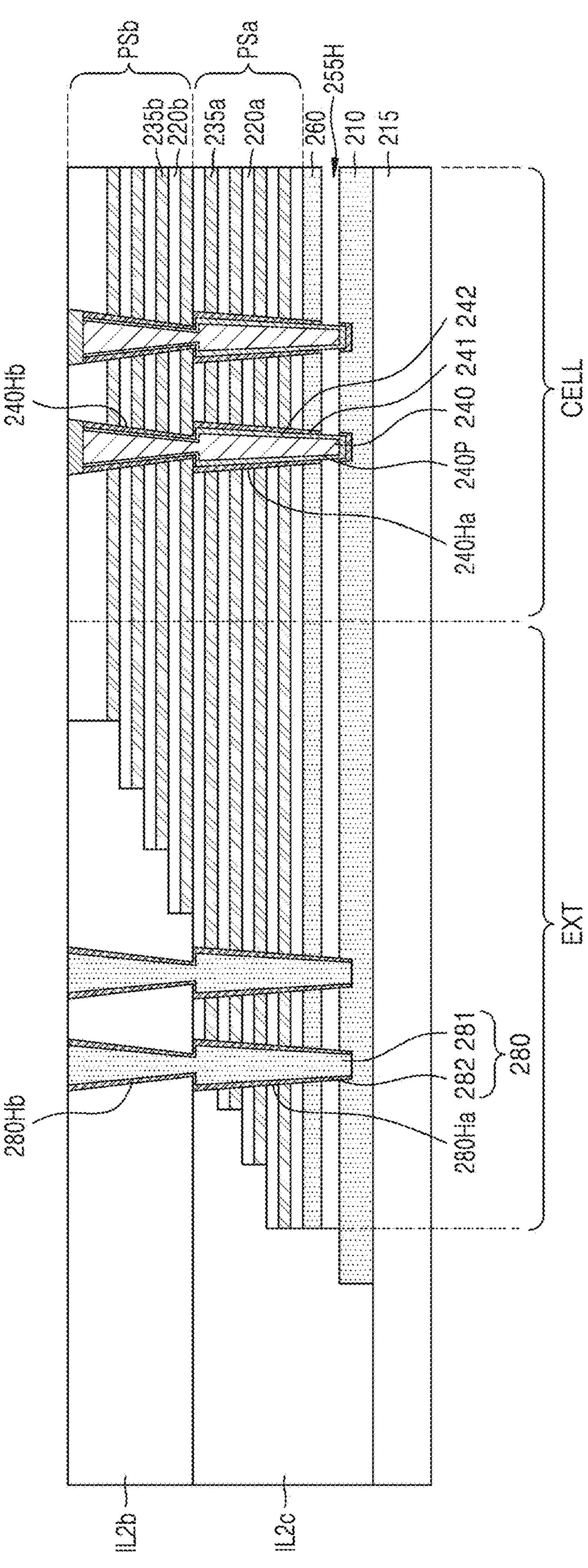

Referring to FIGS. 3F and 3G, an opening 240P passing through the gate insulating layer 241 may be formed by removing a portion of the gate insulating layer 241 of the channel structure 240 exposed in the space 255H. The channel layer 242 may be exposed in the space 255H through the opening 240P. In some embodiments, the insulating layer 282 of the dummy channel structure 280 is sufficiently thick, and thus, even when the insulating layer 282 of the dummy channel structure 280 is exposed to an etchant for removing a portion of the gate insulating layer 241 of the channel structure 240, the conductive layer 281 may not be exposed in the space 255H. In another embodiment, the insulating layer 282 of the dummy channel structure 280 may be exposed to an etchant for removing a portion of the gate insulating layer 241 of the channel structure 240, and thus, an exposed portion of the insulating layer 282 may be etched to expose the conductive layer 281 in the space 255H.

Figure 3H:
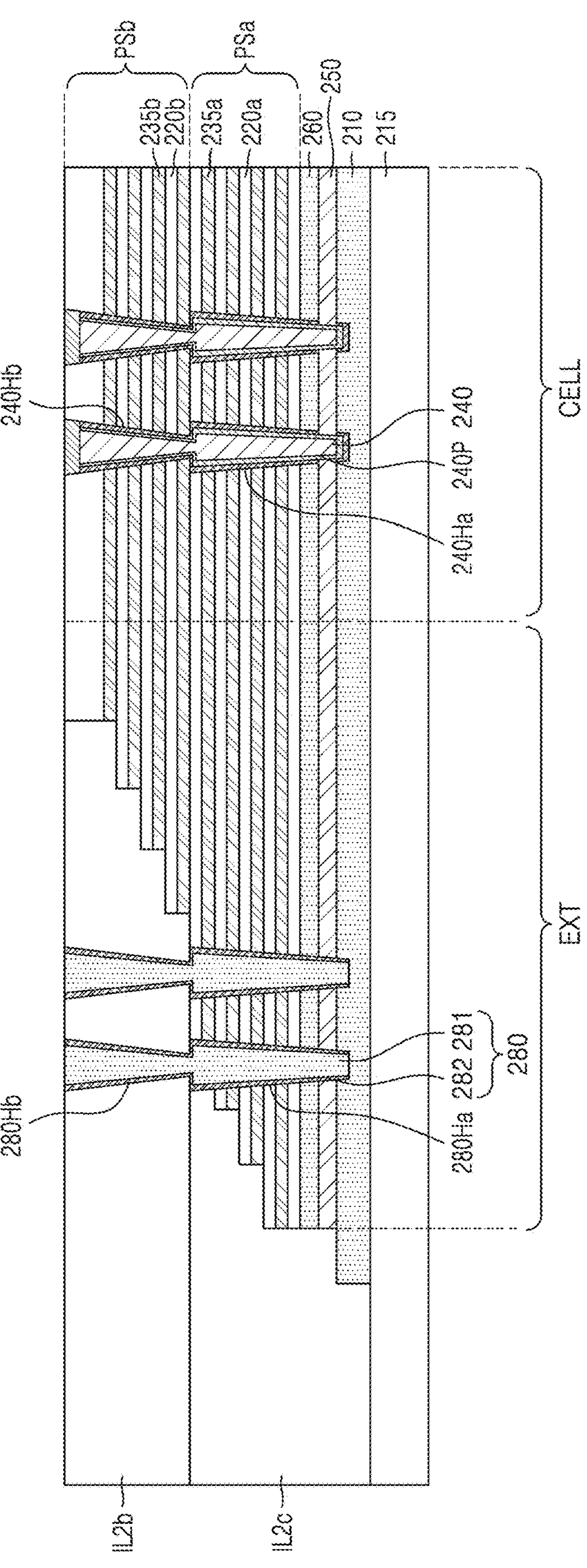

Referring to FIGS. 3G and 3H, the lower conductive layer 250 may be formed in the space 255H. The lower conductive layer 250 may contact the channel layer 242 through the opening 240P. In some embodiments, the lower conductive layer 250 may not contact the conductive layer 281. Unlike that shown in FIG. 3H, in some embodiments, the lower conductive layer 250 may pass through the insulating layer 282 and contact the conductive layer 281.

Figure 3I:
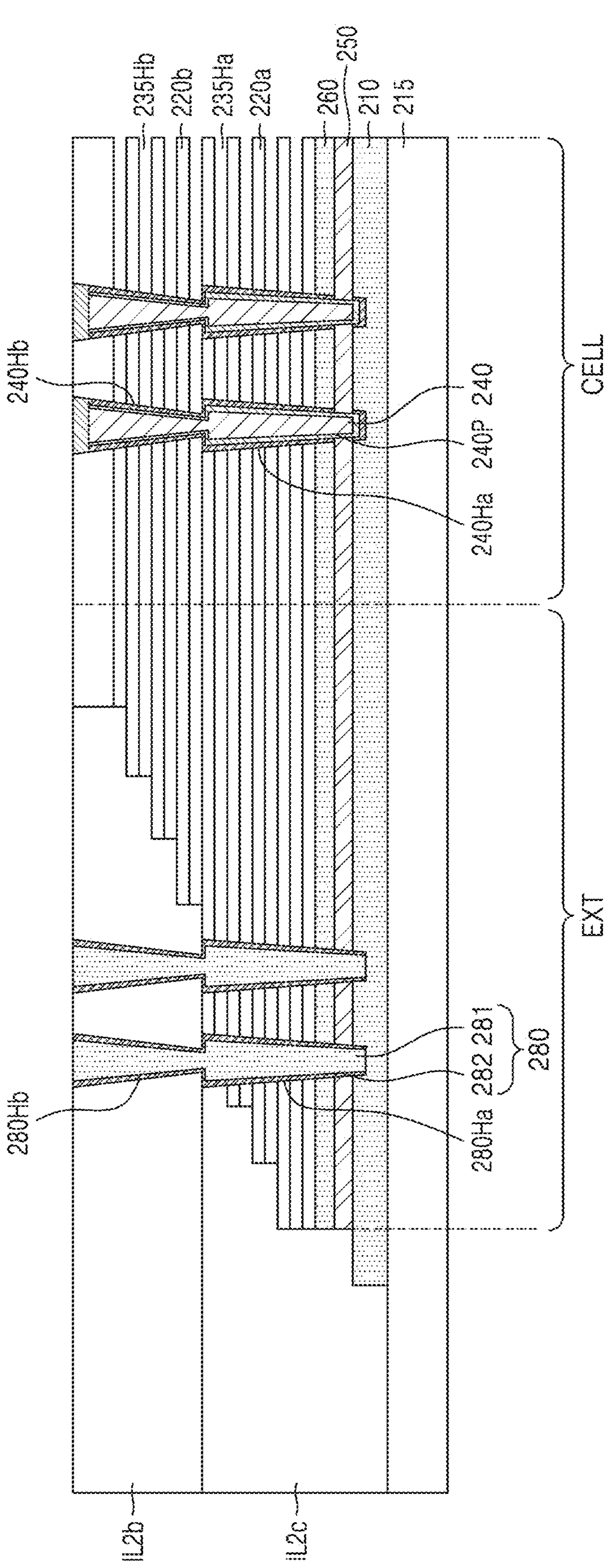

Referring to FIGS. 3H and 3I, a plurality of spaces 235Ha and 235Hb may be formed between a plurality of interlayer insulating layers, for example, the plurality of first and second interlayer insulating layers 220*a* and 220*b*, by removing a plurality of sacrificial layers, for example, a plurality of first and second sacrificial layers 235*a* and 235*b*.

Figure 3J:
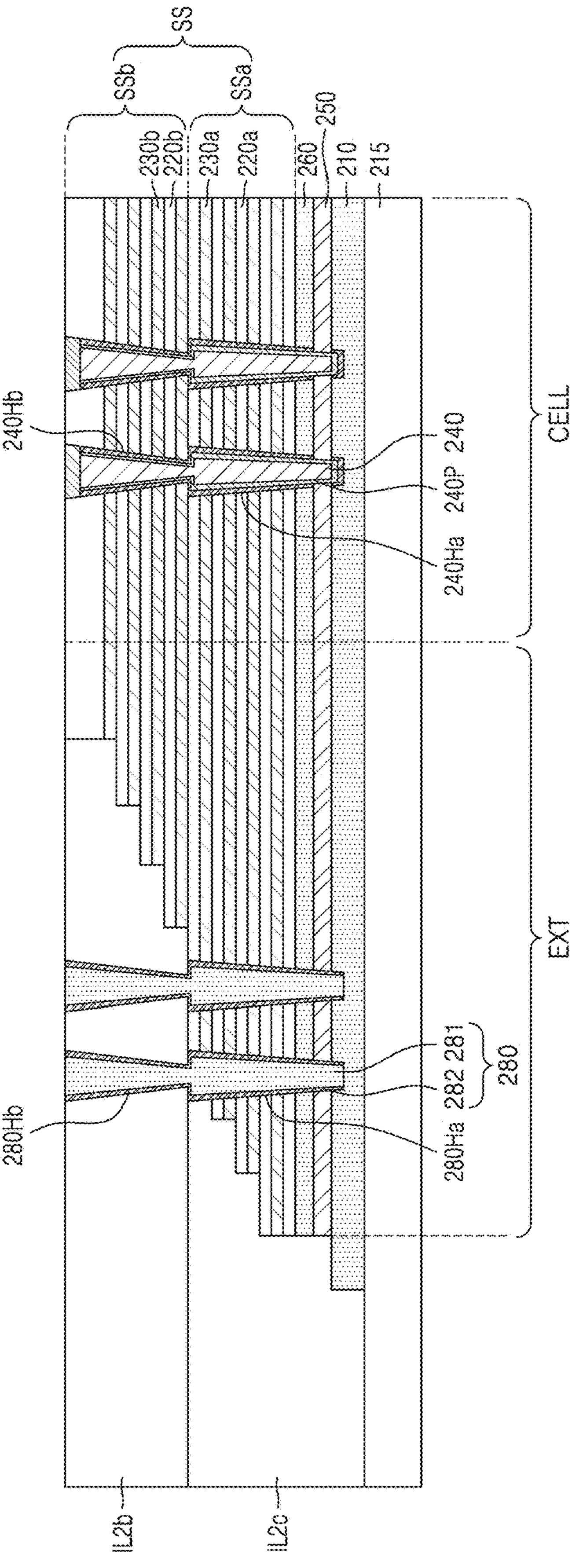

Referring to FIGS. 3I and 3J, a plurality of gate layers, for example, the plurality of first and second gate layers 230*a* and 230*b*, may be formed in the plurality of spaces 235Ha and 235Hb between the plurality of interlayer insulating layers, for example, the plurality of first and second interlayer insulating layers 220*a* and 220*b*. Thus, the stack structure SS including the first portion SSa including the first interlayer insulating layer 220*a* and a first gate layer 230*a* alternately stacked above the common source line layer 210 and the second portion SSb including the second interlayer insulating layer 220*b* and a second gate layer 230*b* alternately stacked on the first portion SSa may be formed.

Figure 3K:
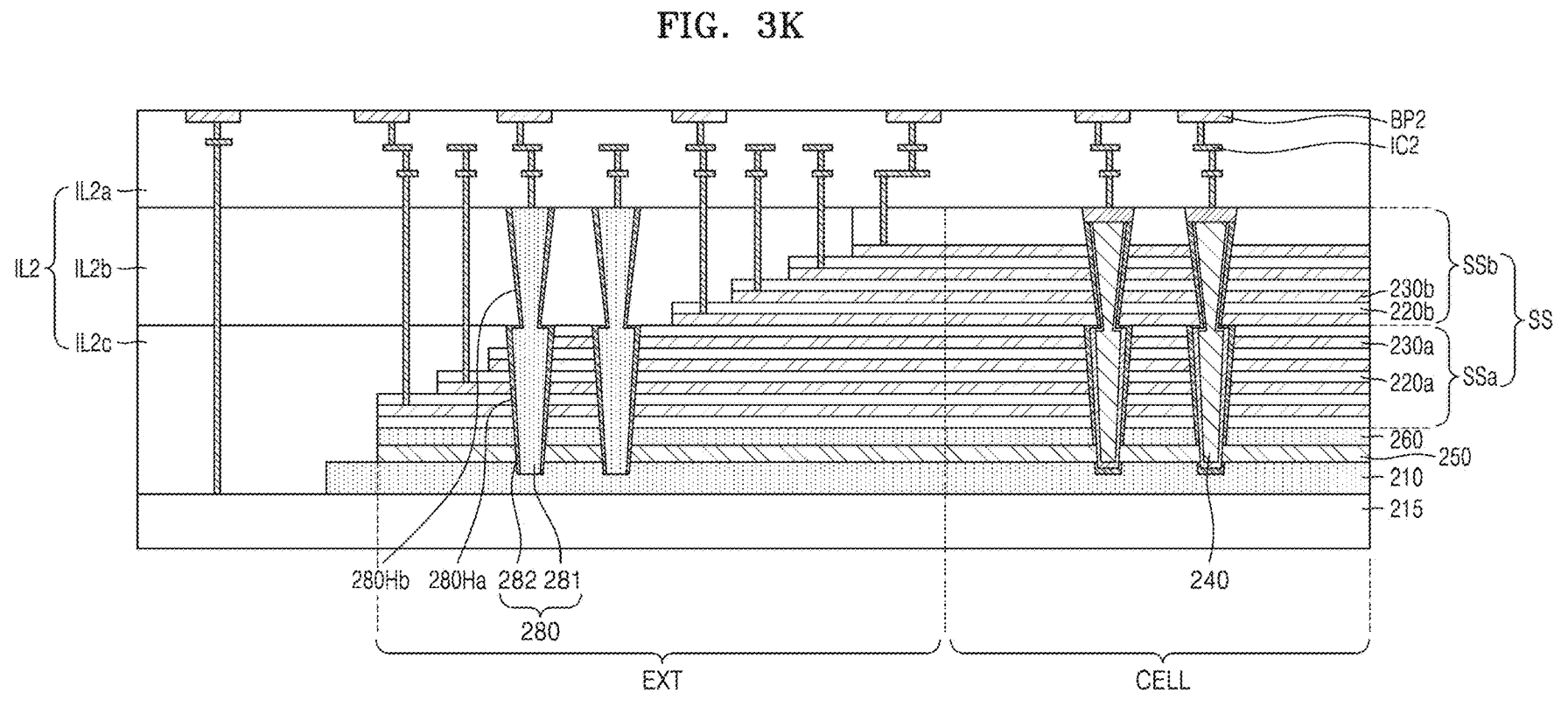

Referring to FIG. 3K, the first portion IL2*a* of the second insulating structure IL2, the second interconnect structure IC2, and the plurality of second bonding pads BP2 may be formed. Thus, the second insulating structure IL2 including the first portion IL2*a*, the second portion IL2*b*, and the third portion IL2*c* may be completed.

Figure 3L:
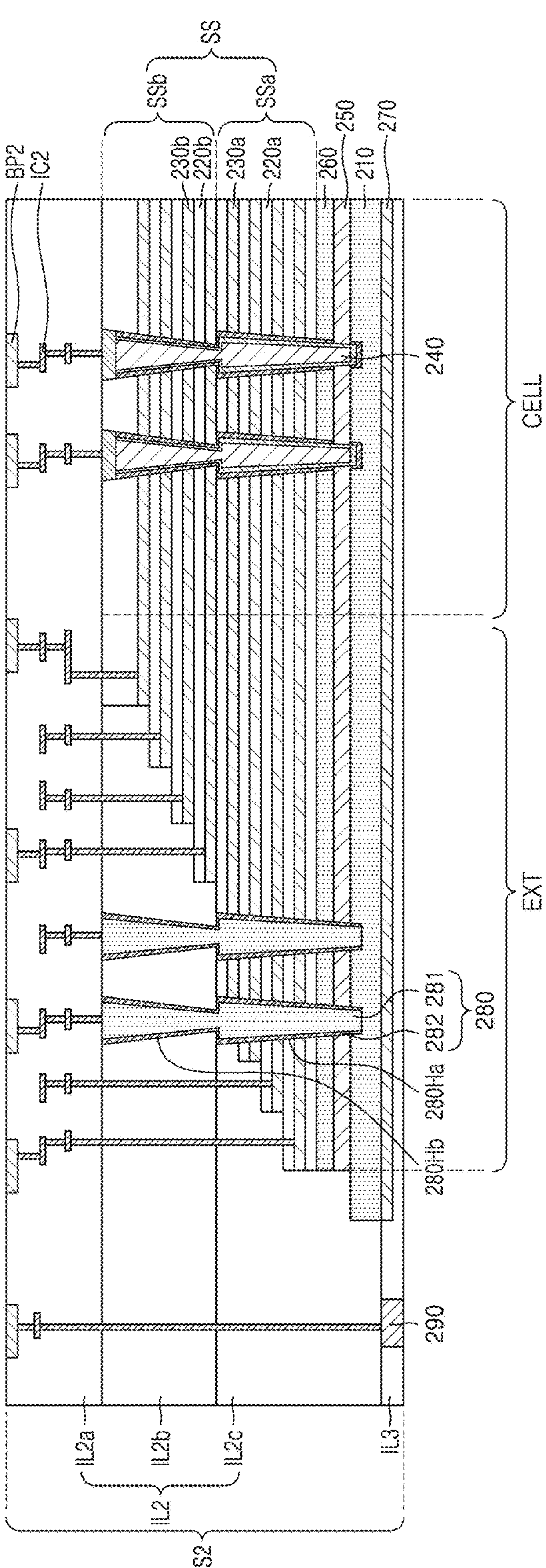

Referring to FIGS. 3K and 3L, the second substrate 215 may be removed from the common source line layer 210 and the second insulating structure IL2. The low-resistance conductive layer 270 on the common source line layer 210, the third insulating structure IL3 on the second insulating structure IL2 and the low-resistance conductive layer 270, and the input/output pad 290 passing through the third insulating structure IL3 may be formed. Thus, the second structure S2 may be completed.

Figure 3M:
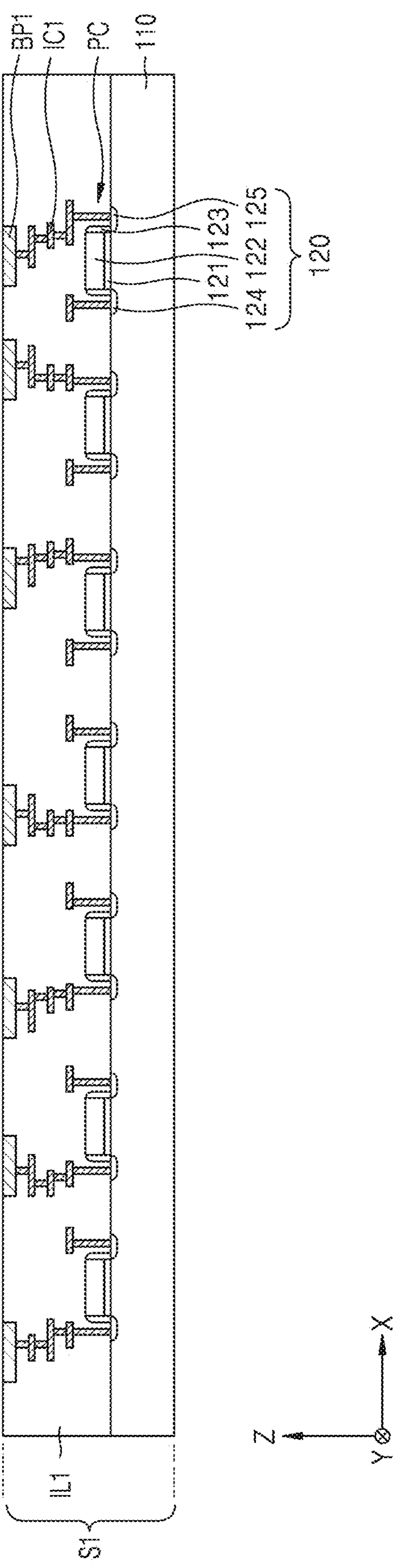

Referring to FIG. 3M, the peripheral circuit PC including the plurality of transistors 120 may be formed on the first substrate 110. Next, the first insulating structure IL1 on the first substrate 110 and the peripheral circuit PC, the first interconnect structure IC1 in the first insulating structure IL1, and the plurality of first bonding pads BP1 on the first insulating structure IL1 may be formed. Thus, the first structure S1 may be completed.

Referring to FIG. 1A, the first structure S1 may be bonded to the second structure S2 so that the plurality of first bonding pads BP1 contact the plurality of second bonding pads BP2, respectively. Thus, the nonvolatile memory device 100 may be completed.

FIGS. 4A to 4J are cross-sectional views for describing a method of manufacturing the nonvolatile memory device 100A (refer to FIG. 2B), according to embodiments of inventive concepts.

Figure 4A:
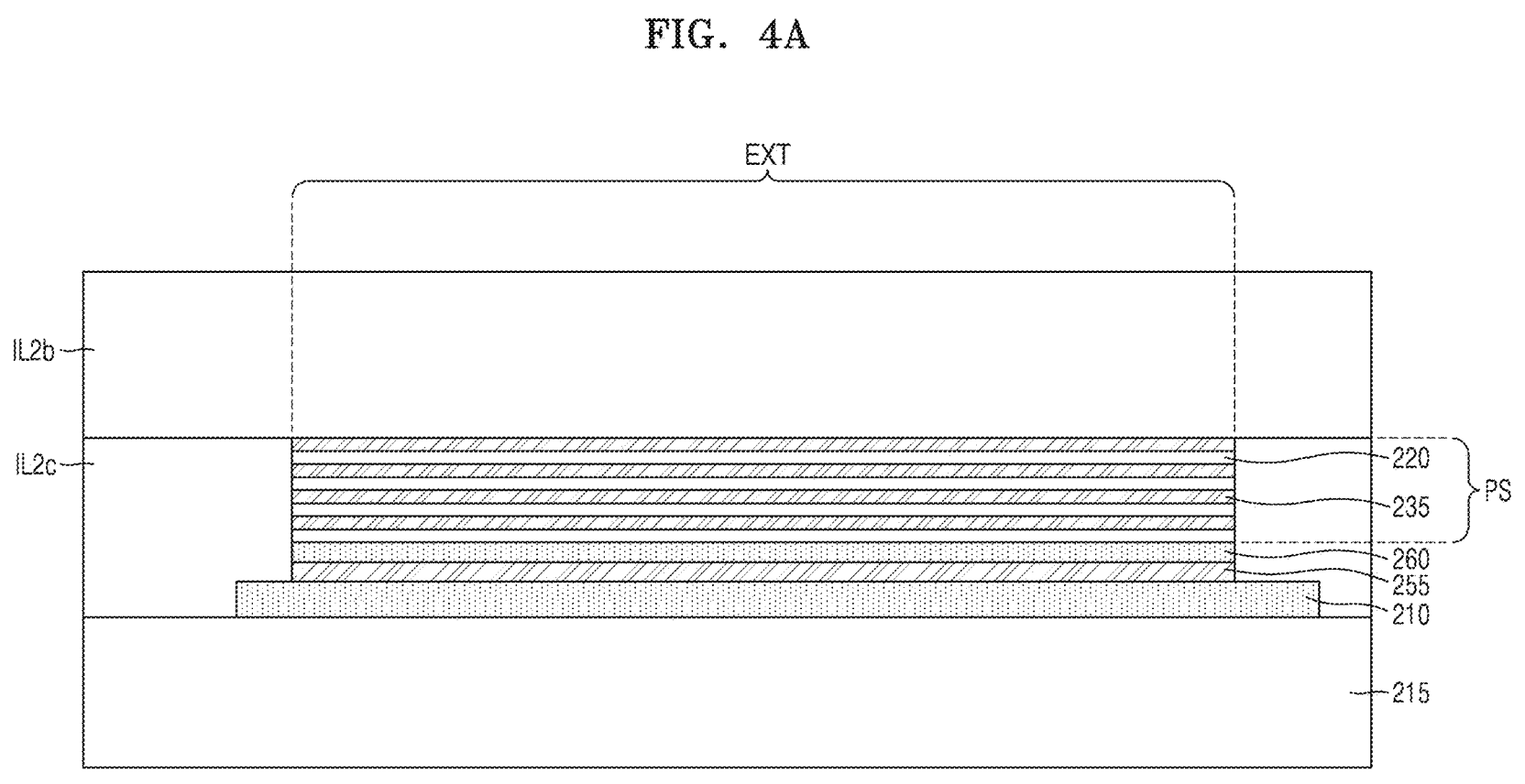

Referring to FIG. 4A, according to the operations described with reference to FIGS. 3A to 3D, the common source line layer 210 on the second substrate 215, the lower sacrificial layer 255 on the common source line layer 210, the lower support layer 260 on the lower sacrificial layer 255, a preliminary stack structure PS on the lower support layer 260, the channel structure 240 (refer to FIG. 3D) passing through the preliminary stack structure PS, the third portion IL2*c* of a second insulating structure on the second substrate 215, and the second portion IL2*b* of the second insulating structure on the third portion IL2*c* of the second insulating structure and the preliminary stack structure PS may be formed. The dummy channel structure 280 (refer to FIG. 3E) may not be formed, may be formed of the same structure as the channel structure 240, or may be formed as shown in FIG. 3E. The preliminary stack structure PS may include a plurality of interlayer insulating layers 220 and a plurality of sacrificial layers 235 alternately stacked on the lower support layer 260. Although not shown in FIG. 4A, according to the operations described with reference to FIGS. 3A to 3D, the step region EXT of the preliminary stack structure PS may be patterned to have a stepped shape.

Figure 4B:
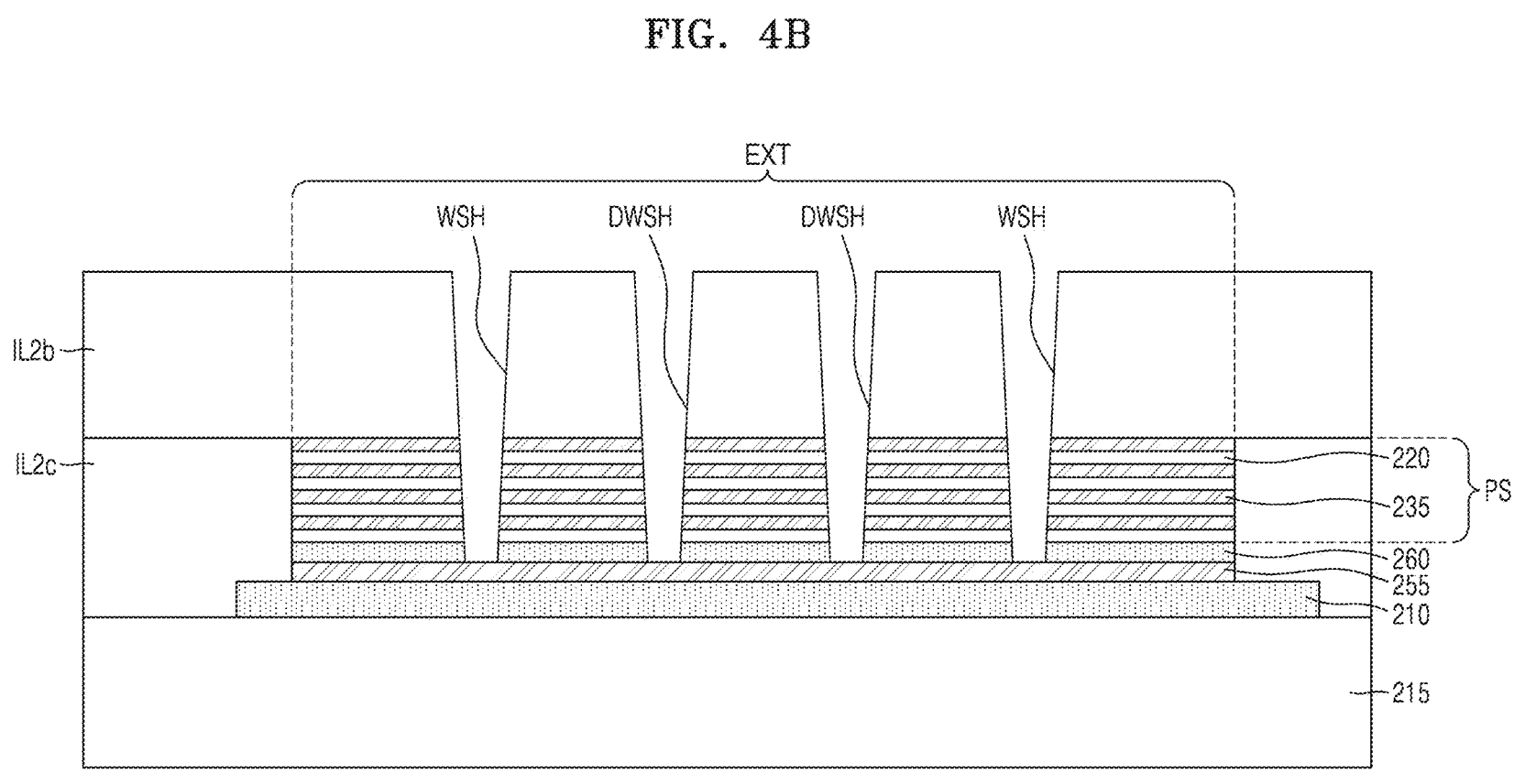

Referring to FIG. 4B, the word line cut WSH and the dummy word line cut DWSH passing through the lower support layer 260, the preliminary stack structure PS, and the second portion IL2*b* of the second insulating structure and exposing the lower sacrificial layer 255 may be formed.

Figure 4C:
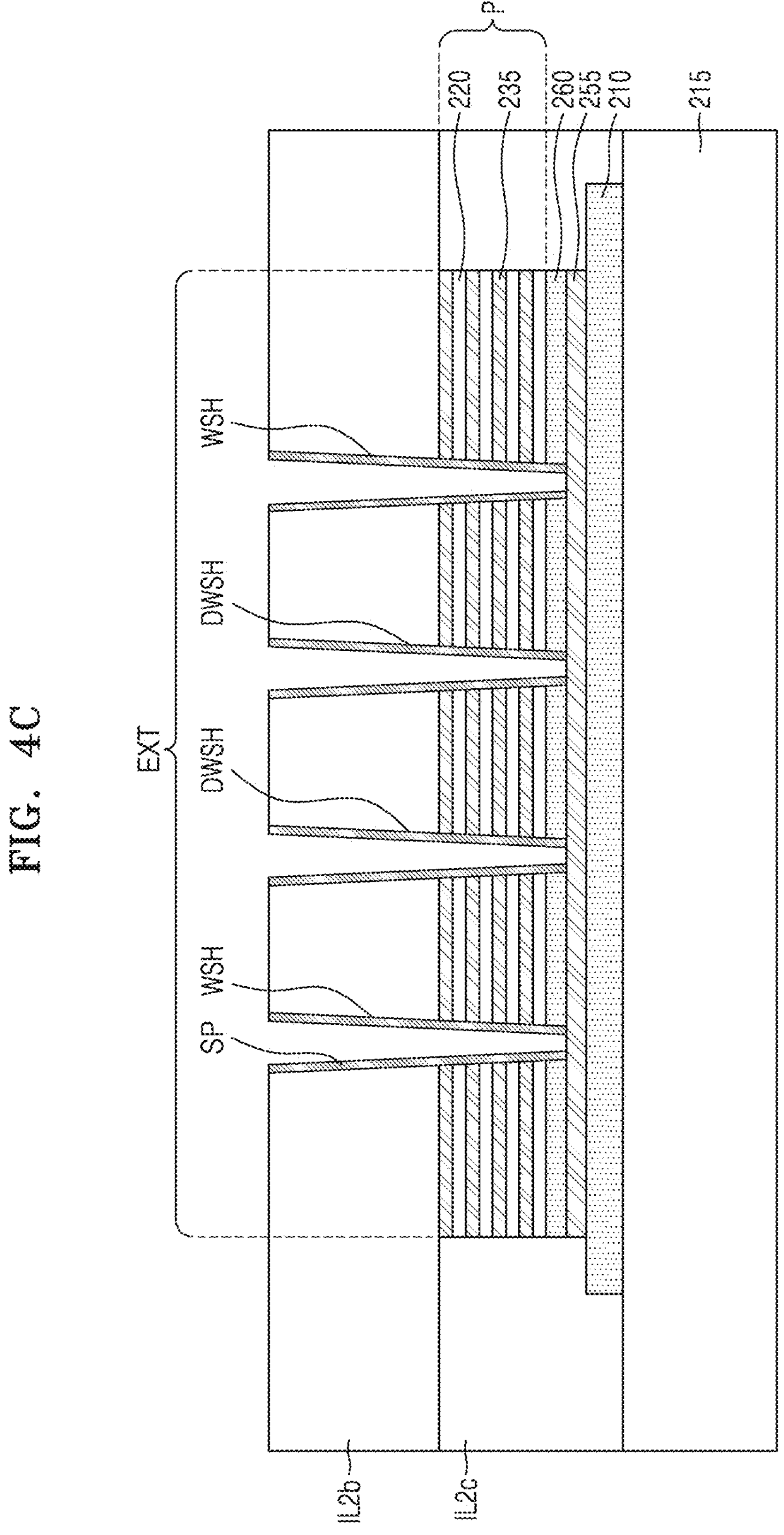

Referring to FIG. 4C, a spacer layer SP may be formed on sidewalls of the word line cut WSH and the dummy word line cut DWSH. For example, the spacer layer SP may be formed on sidewalls and the bottom of the word line cut WSH and the dummy word line cut DWSH and an upper surface of the second portion IL2*b* of the second insulating structure, and portions of the spacer layer SP on the bottom of the word line cut WSH and the dummy word line cut DWSH and the upper surface of the second portion IL2*b* of the second insulating structure may be removed by anisotropically etching the spacer layer SP.

Figure 4D:
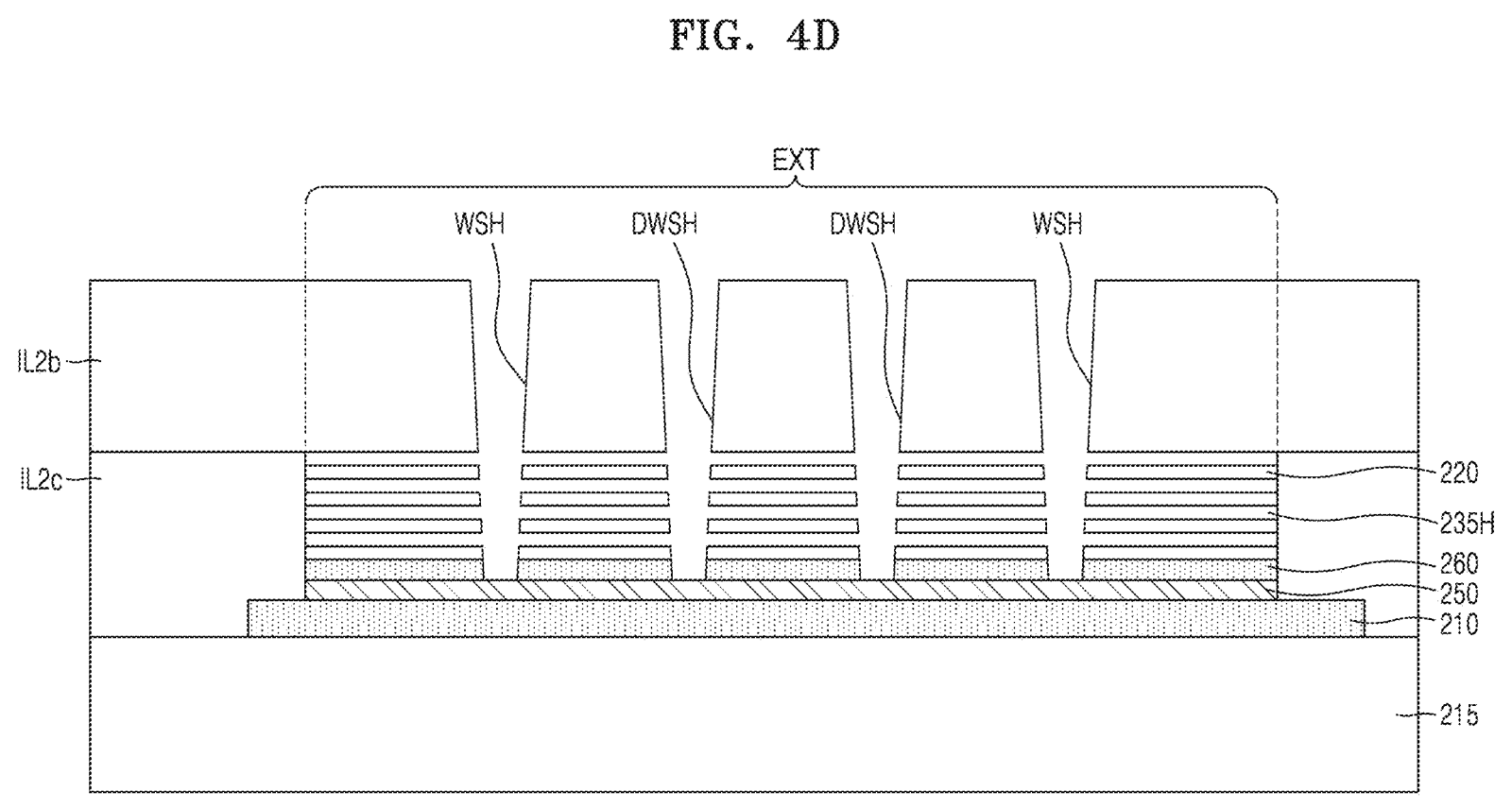

Referring to FIGS. 4C and 4D, the lower sacrificial layer 255 may be removed. As shown in FIG. 3G, the gate insulating layer 241 may be etched to expose the channel layer 242. Next, the lower conductive layer 250 may be filled in a space where the lower sacrificial layer 255 has been removed. Next, the spacer layer SP may be removed from the sidewalls of the word line cut WSH and the dummy word line cut DWSH. Next, a plurality of spaces 235H may be formed between the plurality of interlayer insulating layers 220 by removing the plurality of sacrificial layers 235.

Figure 4E:
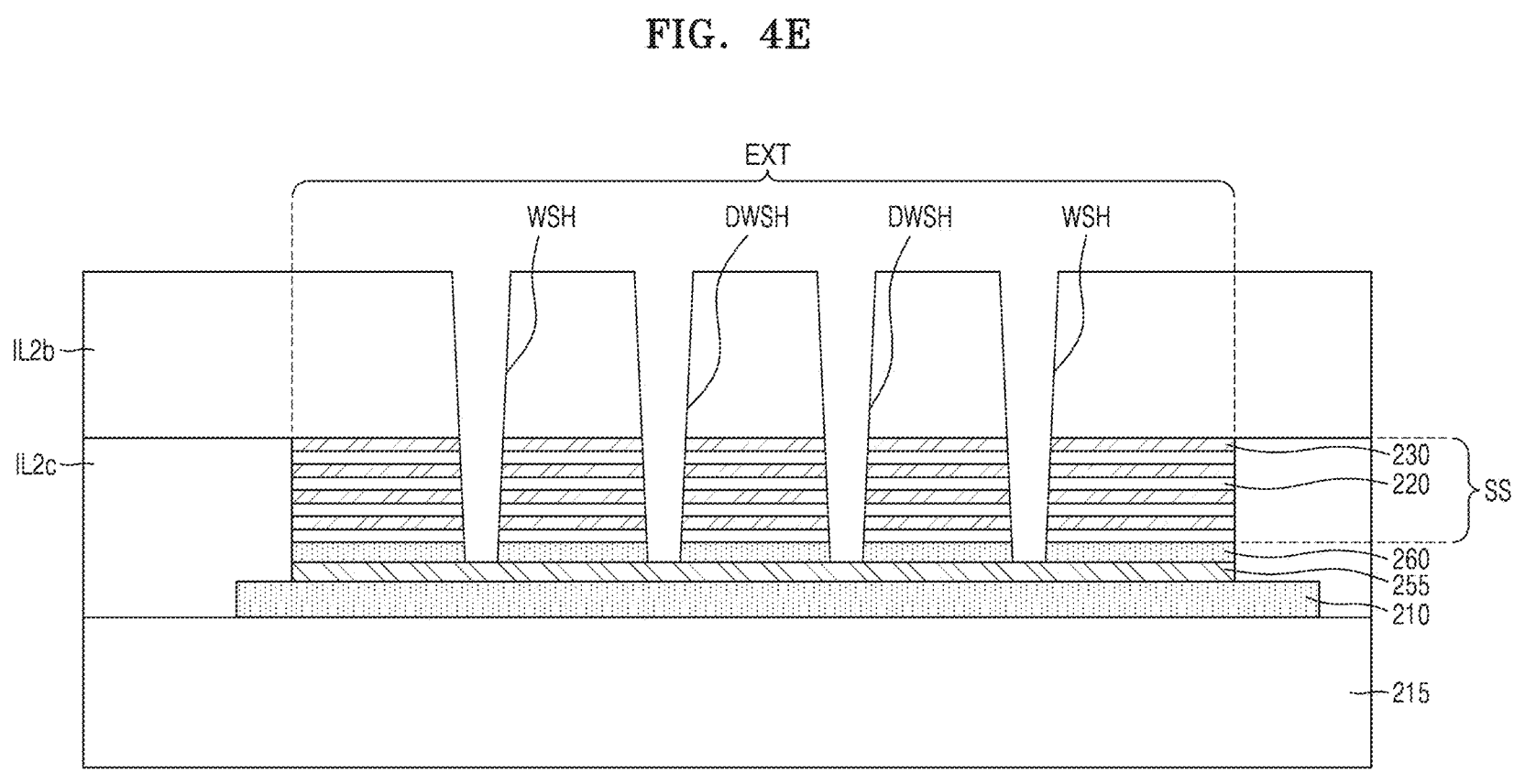

Referring to FIGS. 4D and 4E, a plurality of gate layers 230 may be filled in the plurality of spaces 235H between the plurality of interlayer insulating layers 220. Thus, the stack structure SS including the plurality of gate layers 230 and the plurality of interlayer insulating layers 220 alternately stacked on the lower support layer 260 may be completed.

Figure 4F:
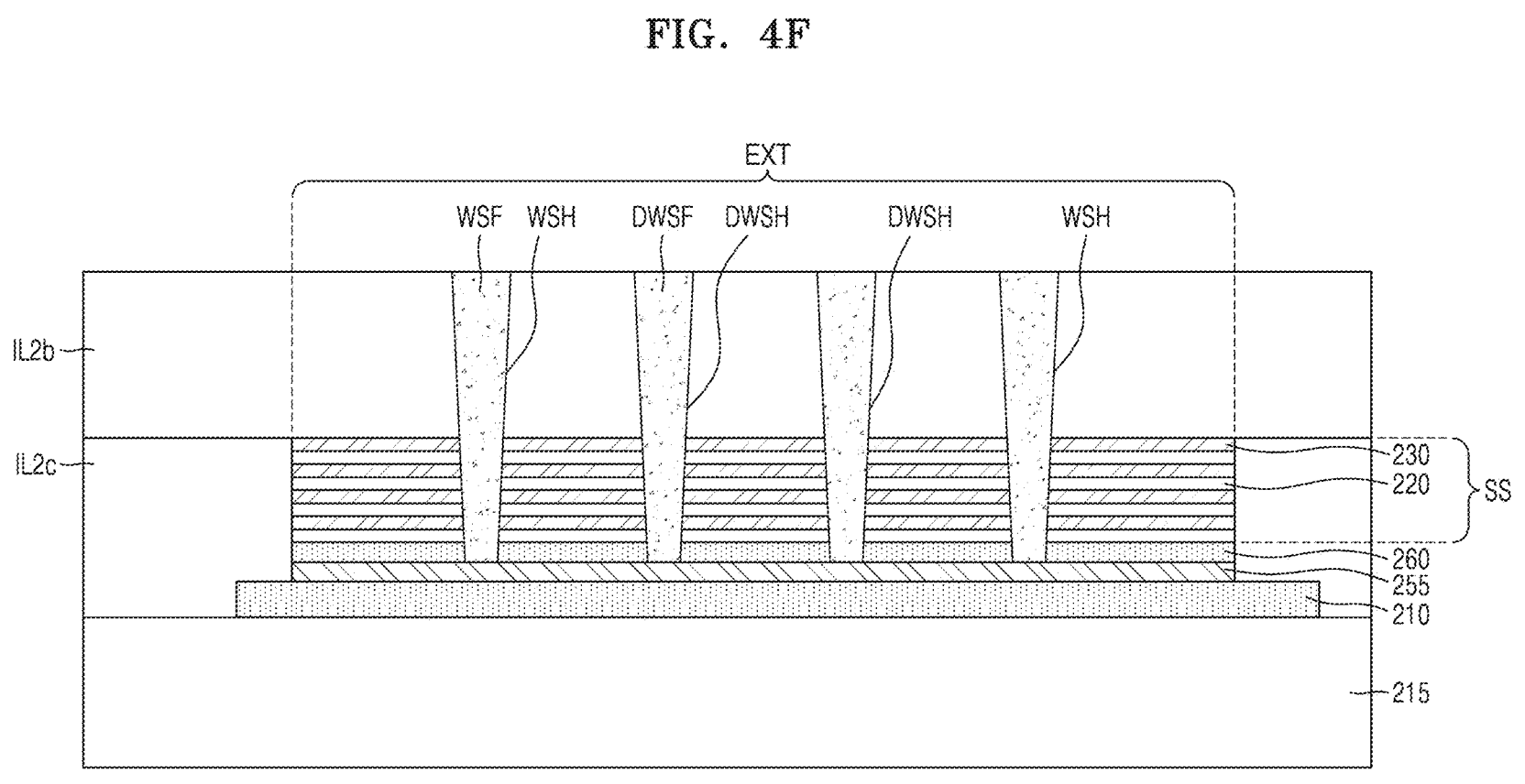

Referring to FIG. 4F, a filling layer WSF and a dummy filling layer DWSF may be filled in the word line cut WSH and the dummy word line cut DWSH, respectively. In some embodiments, the filling layer WSF and the dummy filling layer DWSF may include polysilicon.

Figure 4G:
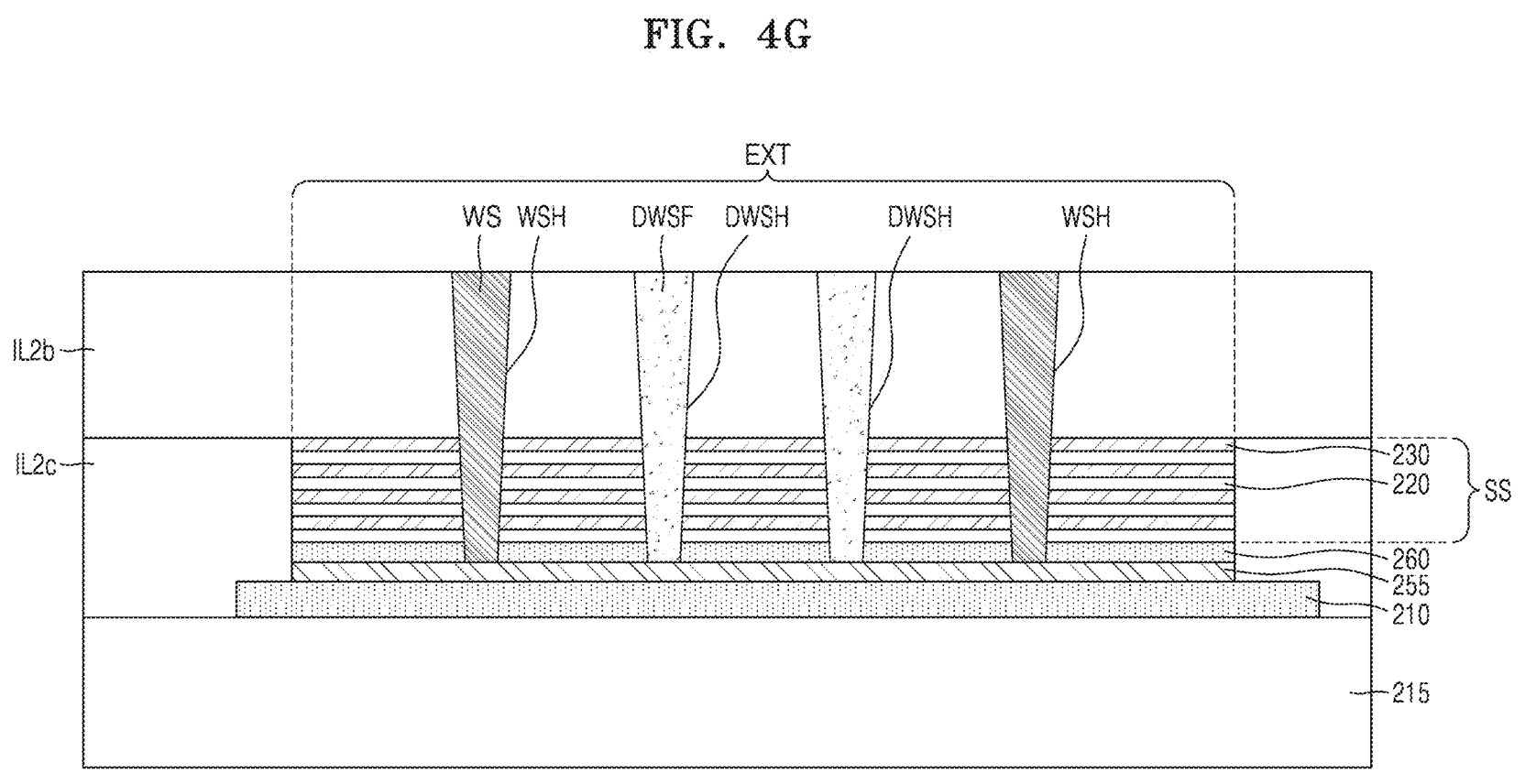

Referring to FIGS. 4F and 4G, the filling layer WSF is removed from the word line cut WSH. To limit and/or prevent the dummy filling layer DWSF from being removed, a mask for covering the dummy filling layer DWSF and exposing the filling layer WSF may be formed before the filling layer WSF is removed. The mask may be removed after the filling layer WSF is removed. After the filling layer WSF is removed, the word line cut structure WS may be formed in the word line cut WSH.

Figure 4H:
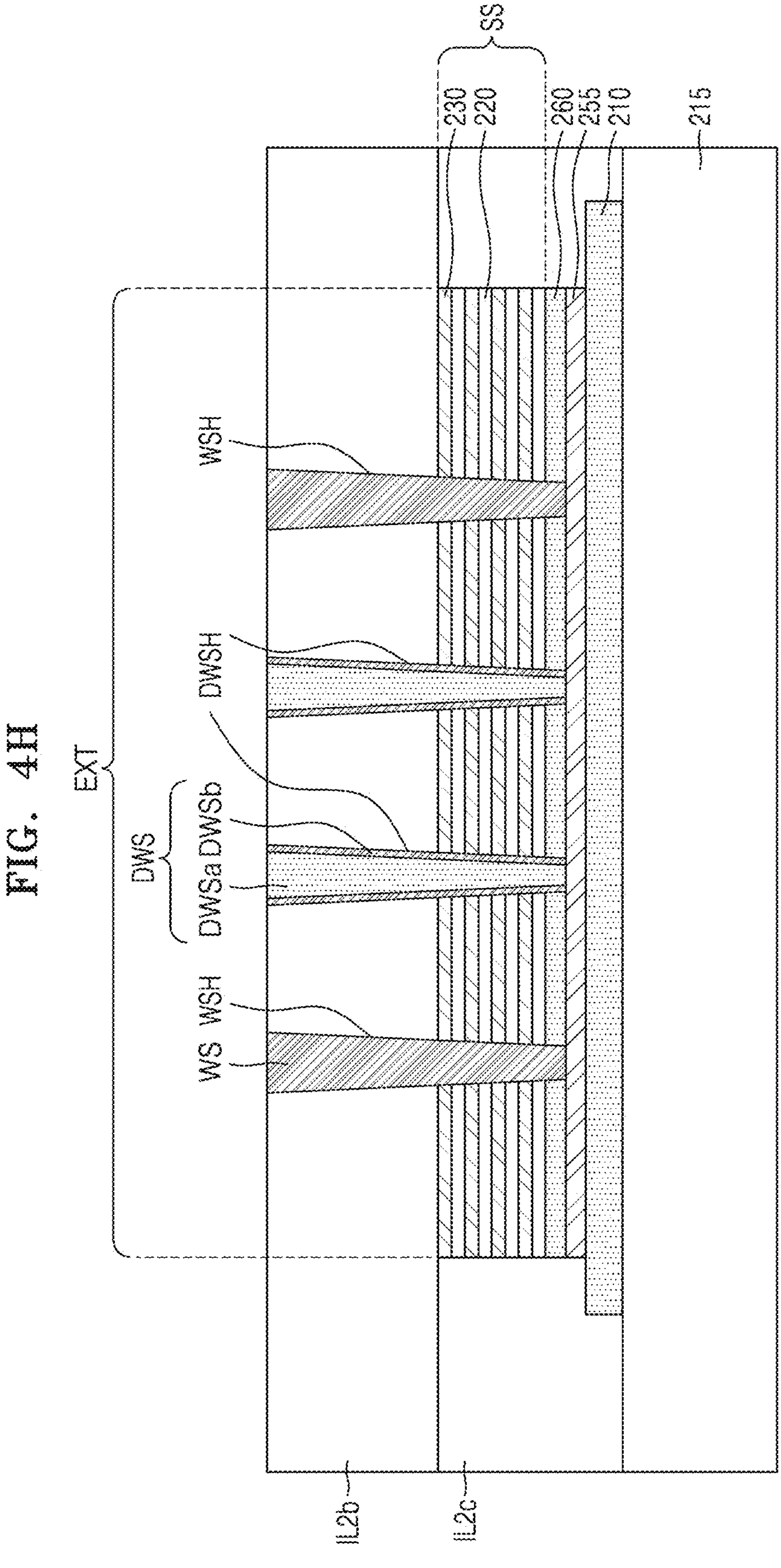
Figure 4I:
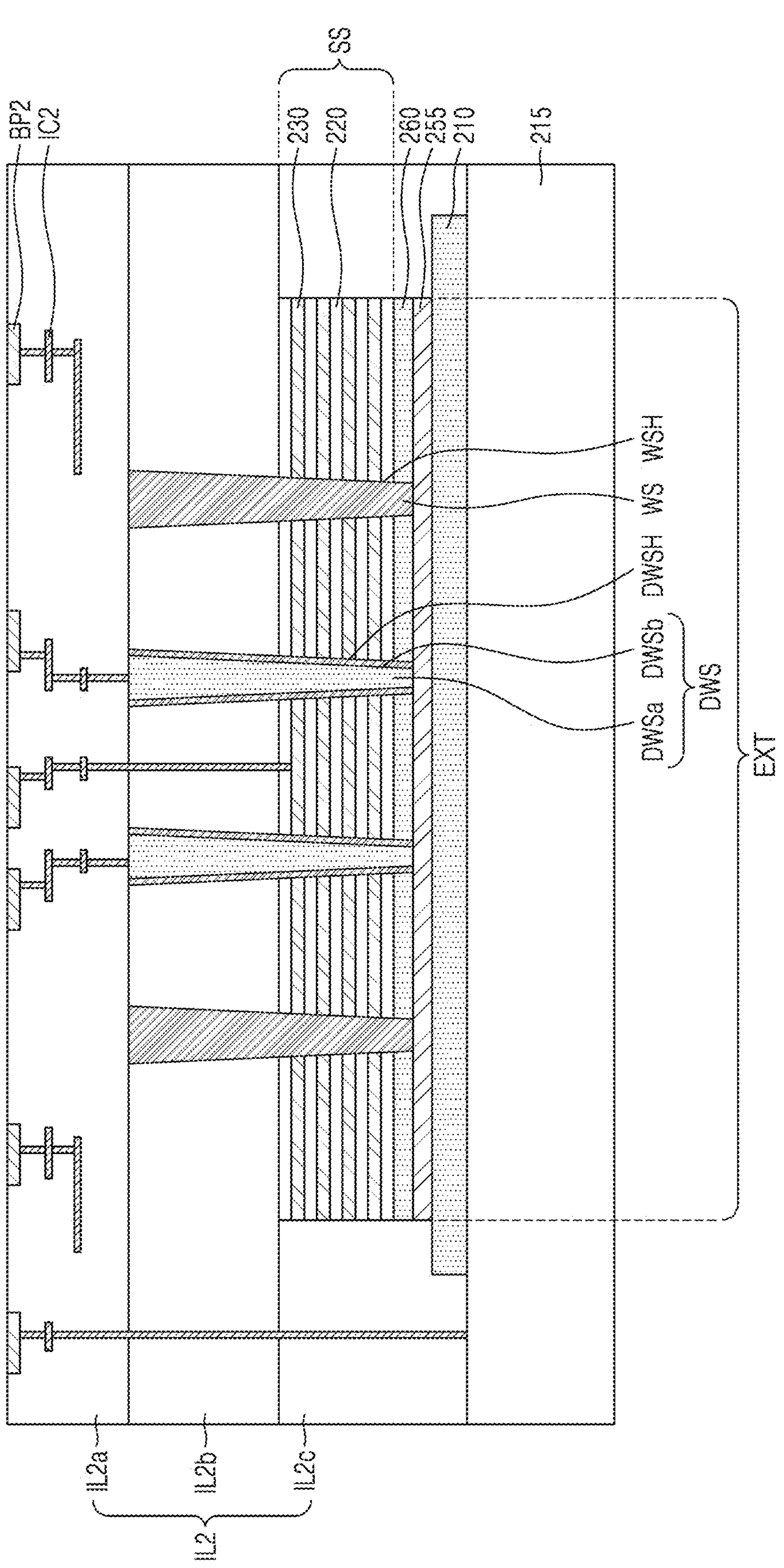

Referring to FIGS. 4G and 4H, the dummy filling layer DWSF is removed from the dummy word line cut DWSH. Next, the insulating layer DWSb may be formed on sidewalls of the dummy word line cut DWSH. For example, the insulating layer DWSb may be formed on sidewalls and the bottom of the dummy word line cut DWSH and an upper surface of the second portion IL2*b* of the second insulating structure, and portions of the insulating layer DWSb on the bottom of the dummy word line cut DWSH and the upper surface of the second portion IL2*b* of the second insulating structure may be removed by anisotropically etching the insulating layer DWSb. Next, the conductive layer DWSa may be formed on the insulating layer DWSb. The conductive layer DWSa may fill the dummy word line cut DWSH together with the insulating layer DWSb.

Referring to FIG. 41, the first portion IL2*a* of the second insulating structure, the second interconnect structure IC2, and the plurality of second bonding pads BP2 may be formed. Thus, the second insulating structure IL2 including the first portion IL2*a*, the second portion IL2*b*, and the third portion IL2*c* may be completed.

Figure 4J:
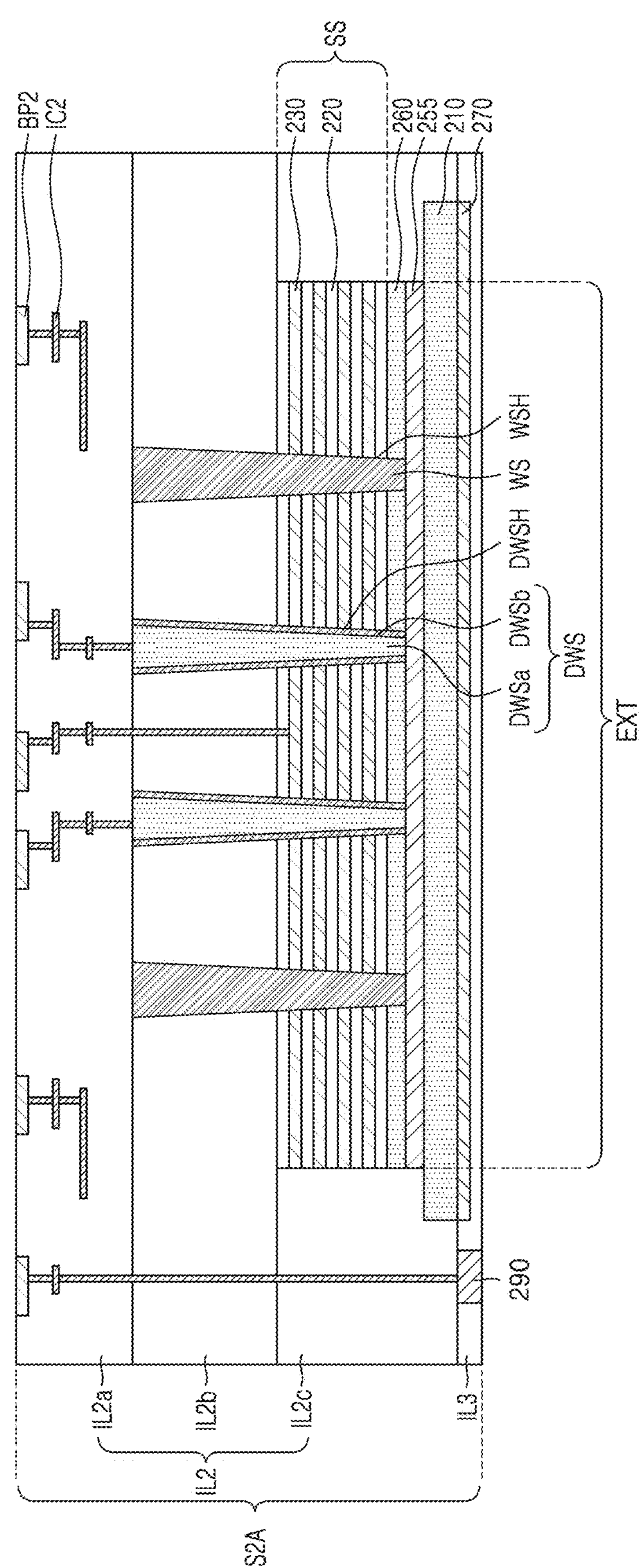

Referring to FIGS. 41 and 4J, the second substrate 215 may be removed from the common source line layer 210 and the second insulating structure IL2. The low-resistance conductive layer 270 on the common source line layer 210, the third insulating structure IL3 on the second insulating structure IL2 and the low-resistance conductive layer 270, and the input/output pad 290 passing through the third insulating structure IL3 may be formed. Thus, the second structure S2A may be completed.

As described with reference to FIG. 3M, the first structure S1 may be prepared. Next, referring to FIG. 2B, the first structure S1 may be bonded to the second structure S2A so that the plurality of first bonding pads BP1 contact the plurality of second bonding pads BP2, respectively. Thus, the nonvolatile memory device 100A may be completed.

Figure 5:
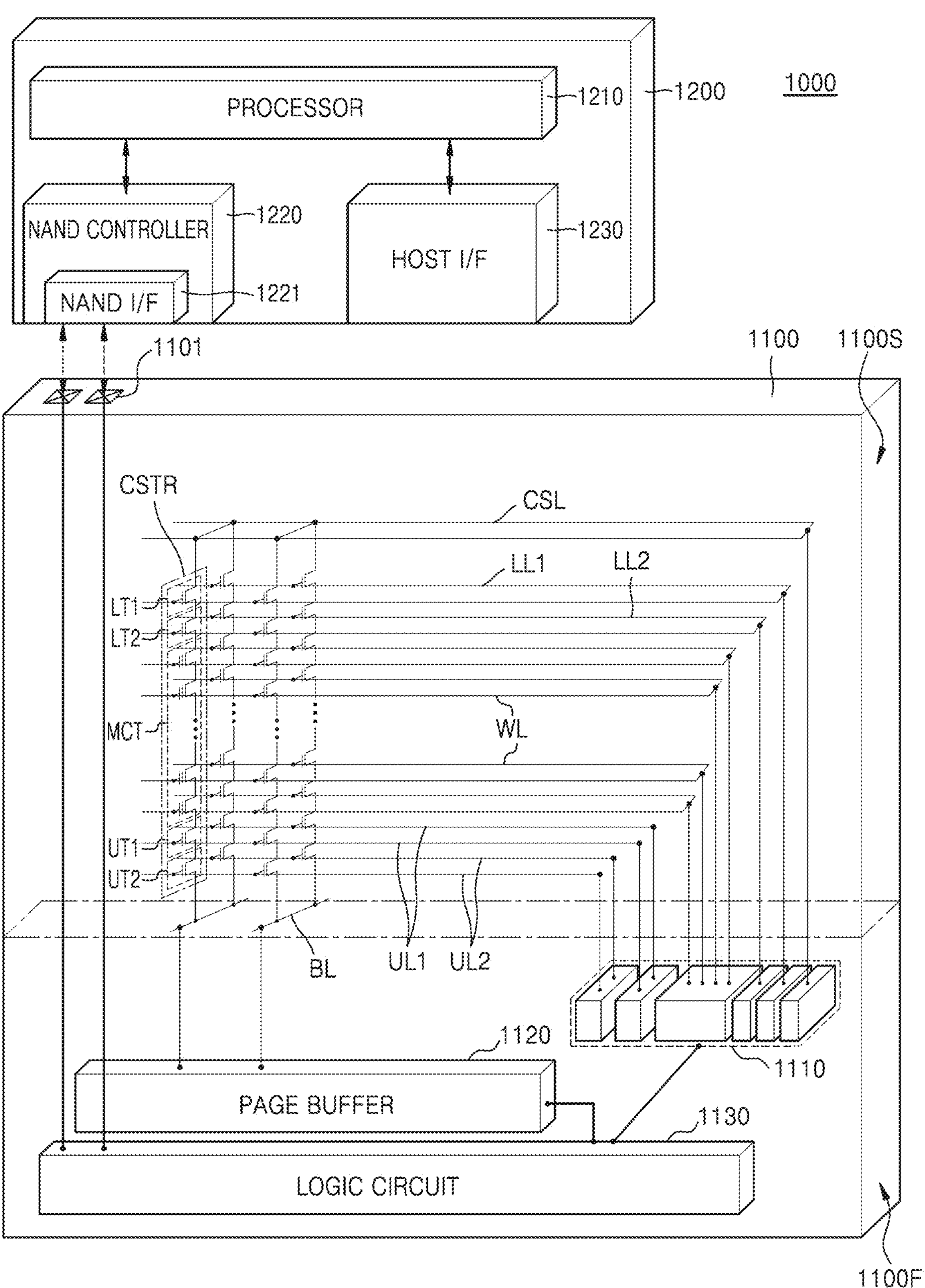
FIG. 5 is a schematic diagram of a memory system including a nonvolatile memory device, according to embodiments of inventive concepts.

FIG. 5 is a schematic diagram of a memory system 1000 including a nonvolatile memory device, according to embodiments of inventive concepts.

Referring to FIG. 5, the memory system 1000 may include one or more memory devices 1100 and a memory controller 1200 electrically connected to the memory device 1100. The memory system 1000 may be, for example, a solid-state drive (SSD) device, a universal serial bus (USB) device, a computing system, a medical device, or a communication device including at least one memory device 1100.

The memory device 1100 may be a nonvolatile memory device. For example, the memory device 1100 may be one of the nonvolatile memory devices 100 and 100A described with reference to FIGS. 1A to 2B or a NAND flash memory device including a combination thereof. The memory device 1100 may include a first structure 1100F and a second structure 1100S on the first structure 1100F. The first structure 1100F may correspond to the first structure S1 shown in FIGS. 1A and 2B. The peripheral circuit PC shown in FIGS. 1A and 2B may include a row decoder 1110, a page buffer 1120, and a logic circuit 1130.

The second structure 1100S may correspond to the second structures S2 and S2A shown in FIGS. 1A and 2B. The second structure 1100S may include a bit line BL, a common source line CSL, a plurality of word lines WL, string selection lines UL1 and UL2, ground selection lines LL1 and LL2, and a plurality of memory cell strings CSTR between the bit line BL and the common source line CSL. The second interconnect structure IC2 shown in FIGS. 1A and 2B may include the bit line BL, a word line WL, the string selection lines UL1 and UL2, and the ground selection lines LL1 and LL2. The channel structure 240 and a plurality of gate layers, for example, the plurality of first and second gate layers 230*a* and 230*b* shown in FIG. 1A or the plurality of gate layers 230 shown in FIG. 2B may constitute a memory cell string CSTR. The common source line layer 210 and the low-resistance conductive layer 270 shown in FIGS. 1A and 2B may correspond to the common source line CSL.

In the second structure 1100S, each of the plurality of memory cell strings CSTR may include ground selection transistors LT1 and LT2 adjacent to the common source line CSL, string selection transistors UT1 and UT2 adjacent to the bit line BL, and a plurality of memory cell transistors MCT arranged between the ground selection transistors LT1 and LT2 and the string selection transistors UT1 and UT2. The number of ground selection transistors LT1 and LT2 and the number of string selection transistors UT1 and UT2 may be variously modified according to embodiments. The channel structure 240 and one gate layer from among the plurality of gate layers, for example, the plurality of first and second gate layers 230*a* and 230*b* shown in FIG. 1A or the plurality of gate layers 230 shown in FIG. 2B may constitute one of a plurality of transistors, for example, the ground selection transistors, string selection transistors, and memory cell transistors LT1, LT2, UT1, UT2, and MCT.

In embodiments, a plurality of ground selection lines LL1 and LL2 may be connected to gate electrodes of the ground selection transistors LT1 and LT2, respectively. The word line WL may be connected to a gate electrode of a memory cell transistor MCT. A plurality of string selection lines UL1 and UL2 may be connected to gate electrodes of the string selection transistors UT1 and UT2, respectively.

The common source line CSL, the plurality of ground selection lines LL1 and LL2, the plurality of word lines WL, and the plurality of string selection lines UL1 and UL2 may be connected to the row decoder 1110. A plurality of bit lines BL may be electrically connected to the page buffer 1120.

The memory device 1100 may communicate with the memory controller 1200 through an input/output pad 1101 electrically connected to the logic circuit 1130. The input/output pad 1101 may be electrically connected to the logic circuit 1130. The input/output pad 1101 may be the input/output pad 290 shown in FIGS. 1A and 2B.

The memory controller 1200 may include a processor 1210, a NAND controller 1220, and a host interface 1230. In some embodiments, the memory system 1000 may include a plurality of memory devices 1100, and in this case, the memory controller 1200 may control the plurality of memory devices 1100.

The processor 1210 may control an overall operation of the memory system 1000 including the memory controller 1200. The processor 1210 may operate according to certain firmware and may access the memory device 1100 by controlling the NAND controller 1220. The NAND controller 1220 may include a NAND interface 1221 for processing communication with the memory device 1100. A control command for controlling the memory device 1100, data to be written to the plurality of memory cell transistors MCT of the memory device 1100, data to be read from the plurality of memory cell transistors MCT of the memory device 1100, and the like may be transmitted through the NAND interface 1221. The host interface 1230 may provide a communication function between the memory system 1000 and an external host. When a control command is received from an external host through the host interface 1230, the processor 1210 may control the memory device 1100 in response to the control command.

Figure 6:
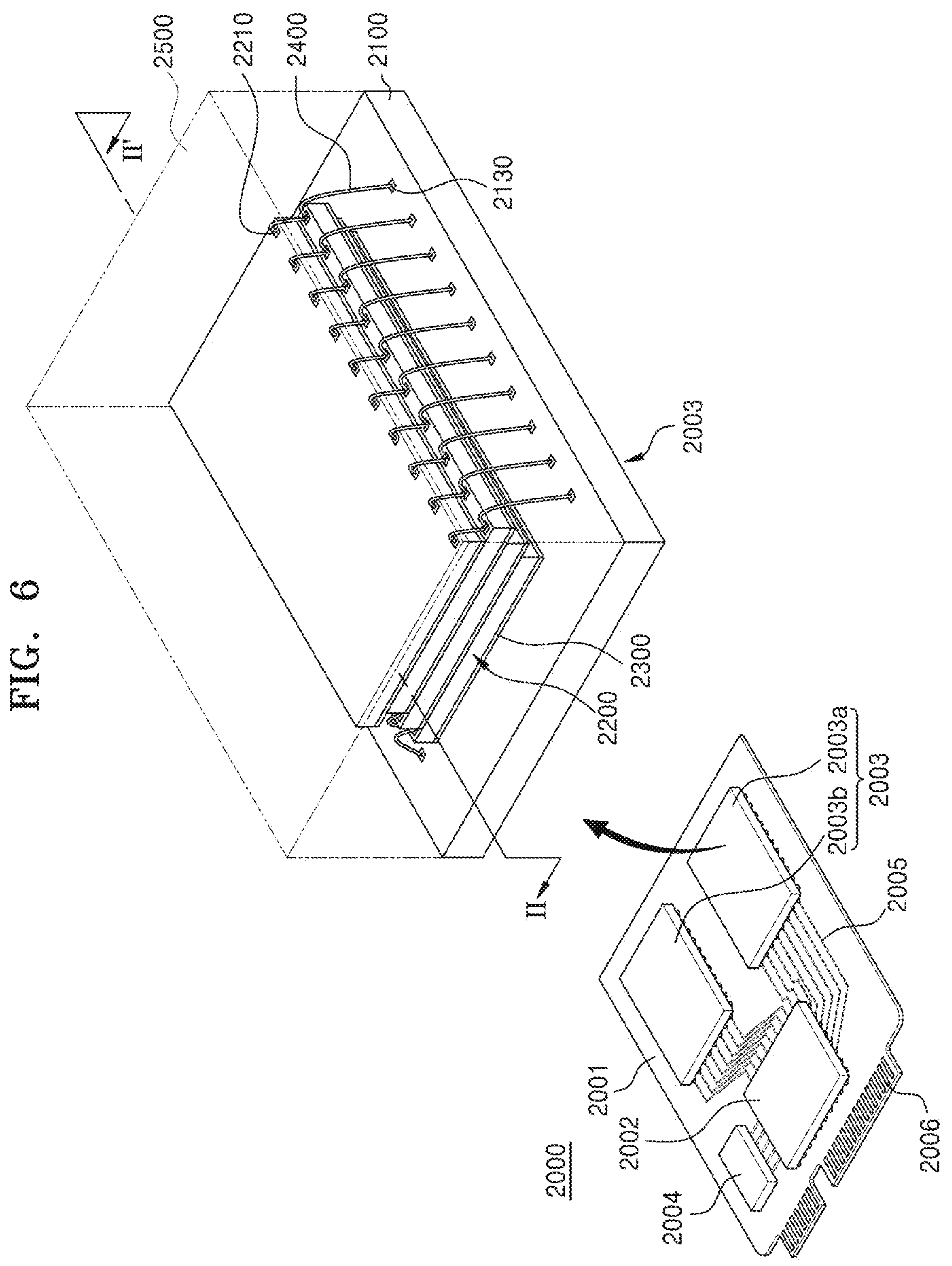
FIG. 6 is a schematic perspective view of a memory system including a nonvolatile memory device, according to embodiments of inventive concepts.

FIG. 6 is a schematic perspective view of a memory system 2000 including a nonvolatile memory device, according to embodiments of inventive concepts.

Referring to FIG. 6, the memory system 2000 according to an embodiment of inventive concepts may include a main substrate 2001, a memory controller 2002 mounted on the main substrate 2001, one or more semiconductor packages 2003, and dynamic random access memory (DRAM) 2004. The semiconductor package 2003 and the DRAM 2004 may be connected to the memory controller 2002 by a plurality of wiring patterns 2005 formed on the main substrate 2001.

The main substrate 2001 may include a connector 2006 including a plurality of pins coupled to an external host. The number and arrangement of the plurality of pins in the connector 2006 may vary according to a communication interface between the memory system 2000 and the external host. In embodiments, the memory system 2000 may communicate with an external host according to one of interfaces such as USB, Peripheral Component Interconnect Express (PCI-Express), Serial Advanced Technology Attachment (SATA), and M-PHY for Universal Flash Storage (UFS). In embodiments, the memory system 2000 may operate by power received from an external host through the connector 2006. The memory system 2000 may further include a power management integrated circuit (PMIC) for distributing power received from the external host to the memory controller 2002 and the semiconductor package 2003.

The memory controller 2002 may write data to the semiconductor package 2003 or read data from the semiconductor package 2003 and may improve an operation speed of the memory system 2000.

The DRAM 2004 may be a buffer memory for mitigating a speed difference between the semiconductor package 2003, which is a data storage space, and an external host. The DRAM 2004 included in the memory system 2000 may also operate as a type of cache memory and may provide a space for temporarily storing data in a control operation for the semiconductor package 2003. When the memory system 2000 includes the DRAM 2004, the memory controller 2002 may further include a DRAM controller for controlling the DRAM 2004 in addition to a NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the plurality of semiconductor chips 2200 on the package substrate 2100, an adhesive layer 2300 arranged on a lower surface of each of the plurality of semiconductor chips 2200, a connection structure 2400 electrically connecting the plurality of semiconductor chips 2200 and the package substrate 2100 to each other, and a molding layer 2500 over the package substrate 2100 and covering the plurality of semiconductor chips 2200 and the connection structure 2400.

The package substrate 2100 may be a printed circuit board including a plurality of package upper pads 2130. Each of the plurality of semiconductor chips 2200 may include an input/output pad 2210. The input/output pad 2210 may correspond to the input/output pad 290 of FIGS. 1A and 2B. Each of the plurality of semiconductor chips 2200 may include at least one of the nonvolatile memory devices 100 and 100A described with reference to FIGS. 1A to 2B.

In embodiments, the connection structure 2400 may be a bonding wire electrically connecting the input/output pad 2210 and a package upper pad 2130 to each other. Accordingly, in the first and second semiconductor packages 2003*a* and 2003*b*, the plurality of semiconductor chips 2200 may be electrically connected to each other by a bonding wire method and may be electrically connected to the package upper pad 2130 of the package substrate 2100. In embodiments, in the first and second semiconductor packages 2003*a* and 2003*b*, the plurality of semiconductor chips 2200 may be electrically connected to each other by a connection structure including a through silicon via (TSV) instead of the connection structure 2400 using a bonding wire method.

In embodiments, the memory controller 2002 and the plurality of semiconductor chips 2200 may be included in one package. In embodiments, the memory controller 2002 and the plurality of semiconductor chips 2200 may be mounted on a separate interposer substrate different from the main substrate 2001, and the memory controller 2002 and the plurality of semiconductor chips 2200 may be connected to each other by a wiring formed on the interposer substrate.

Figure 7:
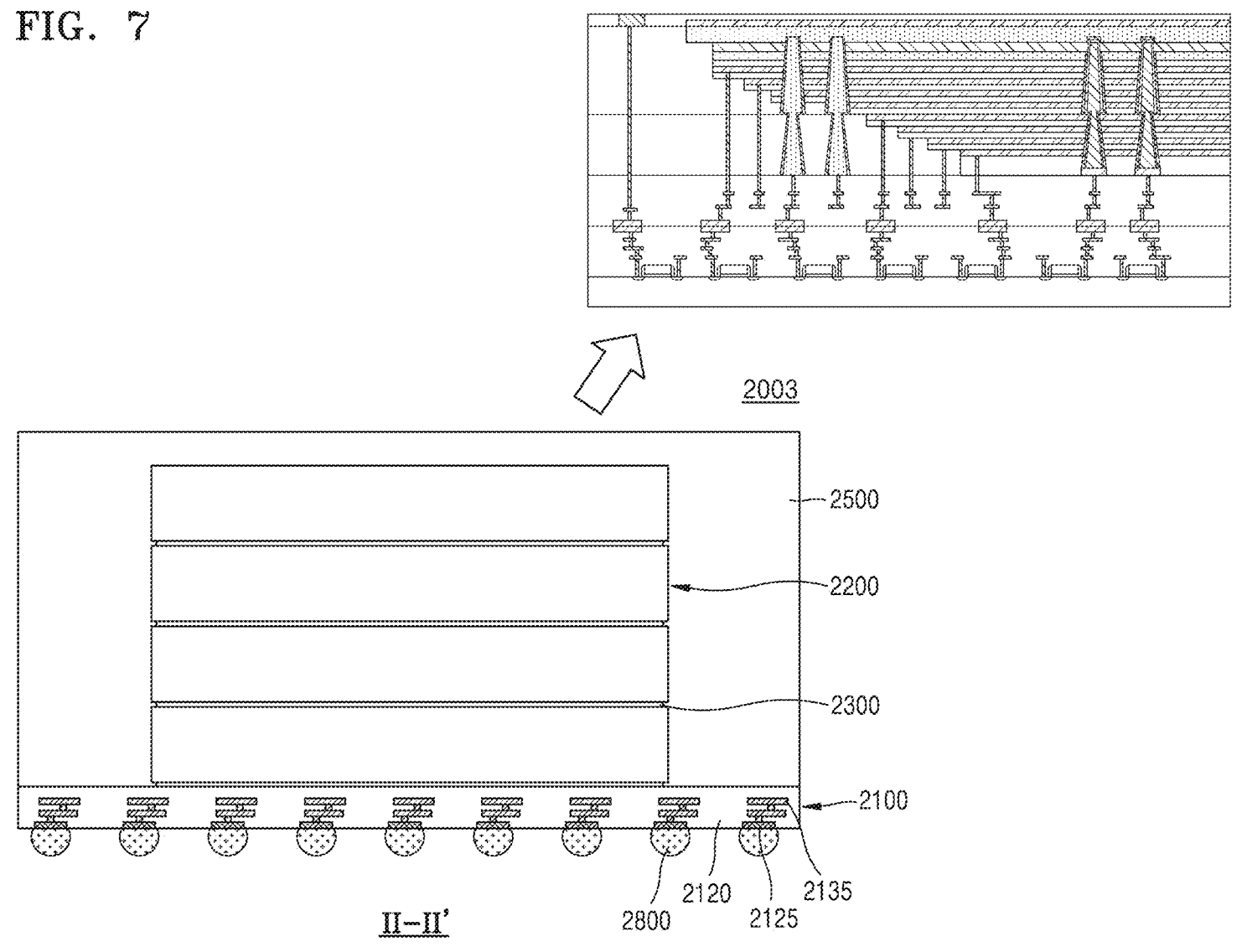

FIG. 7 is a schematic cross-sectional view of the semiconductor package 2003 according to embodiments of inventive concepts.

Referring to FIG. 7, in the semiconductor package 2003, the package substrate 2100 may be a printed circuit board. The package substrate 2100 may include a package substrate body portion 2120, the plurality of package upper pads 2130 (refer to FIG. 6) arranged on an upper surface of the package substrate body portion 2120, a plurality of lower pads 2125 arranged on or exposed through a lower surface of the package substrate body portion 2120, and a plurality of internal wirings 2135 electrically connecting the plurality of package upper pads 2130 (refer to FIG. 6) and the plurality of lower pads 2125 to each other in the package substrate body portion 2120. As shown in FIG. 6, the plurality of package upper pads 2130 may be electrically connected to a plurality of connection structures 2400. As shown in FIG. 7, the plurality of lower pads 2125 may be connected to the plurality of wiring patterns 2005 on the main substrate 2001 of the memory system 2000 shown in FIG. 6 through a plurality of conductive bumps 2800. Each of the plurality of semiconductor chips 2200 may include the nonvolatile memory devices 100 and 100A described with reference to FIGS. 1A to 2B.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While embodiments of inventive concepts have been particularly shown and described with reference to the presented embodiments, it will be understood that various changes in form and details may be made therein without departing from the spirit and scope of the following claims.

What is claimed is:

1. A nonvolatile memory device comprising:

a peripheral structure comprising a peripheral circuit;

a cell structure on the peripheral structure, the cell structure electrically connected to the peripheral structure;

wherein the cell structure comprises:

a first semiconductor layer;

a second semiconductor layer on the first semiconductor layer;

a stack structure including a plurality of gate layers and a plurality of interlayer insulating layers alternately stacked on the second semiconductor layer, the stack structure including a cell region and a step region being on one side of the cell region;

a channel structure passing through the cell region of the stack structure and extending in a vertical direction; and a plurality of dummy structures passing through the step region of the stack structure, each of the plurality of dummy structures comprising a conductive layer extending in the vertical direction, wherein the plurality of dummy structures comprise a first dummy structure and a second dummy structure, wherein the first dummy structure is electrically connected to the peripheral circuit through a interconnect structure, and wherein the second dummy structure is not electrically connected to the peripheral circuit.

2. The nonvolatile memory device of claim 1, wherein the second dummy structure is configured to be electrically floating.

3. The nonvolatile memory device of claim 1, wherein the conductive layer of each of the plurality of dummy structures contacts the first semiconductor layer.

4. The nonvolatile memory device of claim 1, further comprising a third semiconductor layer between the second semiconductor layer and a lowest gate layer among the plurality of gate layers; and a lower conductive layer spaced apart from the second semiconductor layer with the first semiconductor layer therebetween.

5. The nonvolatile memory device of claim 4, wherein the lower conductive layer comprises tungsten (W).

6. The nonvolatile memory device of claim 1, wherein the plurality of dummy structures extend to the second semiconductor layer, and the plurality of dummy structures contact the first semiconductor layer.

7. The nonvolatile memory device of claim 1, wherein each of the plurality of dummy structures further comprises an insulating layer on a sidewall of the conductive layer.

8. The nonvolatile memory device of claim 7, further comprising a third semiconductor layer between the second semiconductor layer and a lowest gate layer among the plurality of gate layers, wherein the insulating layer extends between the third semiconductor layer and the conductive layer.

9. The nonvolatile memory device of claim 1, wherein the conductive layer comprises a semiconductor material, a metal material, or a combination thereof.

10. The nonvolatile memory device of claim 1, wherein the channel structure is in a channel hole passing through the cell region of the stack structure and extending in the vertical direction, wherein the channel structure comprises a gate insulating layer on an inner wall of the channel hole, and a channel layer on the gate insulating layer, and wherein the second semiconductor layer contacts a side wall of the channel layer.

11. A nonvolatile memory device comprising:

a first semiconductor layer;

a second semiconductor layer on the first semiconductor layer;

a stack structure including a plurality of gate layers and a plurality of interlayer insulating layers alternately stacked on the second semiconductor layer;

a channel structure passing through a cell region of the stack structure and the second semiconductor layer in a vertical direction; and a plurality of dummy structures passing through a step region of the stack structure and the second semiconductor layer in the vertical direction, wherein the step region of the stack structure being on one side of the cell region of the stack structure, each of the plurality of dummy structures comprises a conductive layer extending in the vertical direction, an insulating layer on a sidewall of the conductive layer, the conductive layer is electrically connected to the first semiconductor layer, and the insulating layer extends between the conductive layer and the stack structure.

12. The nonvolatile memory device of claim 11, further comprising:

a peripheral structure comprising a peripheral circuit, wherein the plurality of dummy structures comprise a first dummy structure and a second dummy structure, wherein the first dummy structure is electrically connected to the peripheral circuit through an interconnect structure, and wherein the second dummy structure is not electrically connected to the peripheral circuit.

13. The nonvolatile memory device of claim 11, further comprising:

a peripheral structure comprising a peripheral circuit, wherein the plurality of dummy structures comprise a first dummy structure, wherein the first dummy structure is electrically connected to the peripheral circuit through an interconnect structure, and wherein the conductive layer of the first dummy structure is directly connected to the interconnect structure.

14. The nonvolatile memory device of claim 11, wherein at least a portion of an outer wall of the insulating layer contacts the second semiconductor layer.

15. The nonvolatile memory device of claim 11, wherein the insulating layer is on an inner wall of a dummy hole passing through the step region of the stack structure, and wherein the conductive layer fills an interior of the dummy hole on the insulating layer.

16. The nonvolatile memory device of claim 11, wherein the channel structure is in a channel hole passing through the cell region of the stack structure and extending in the vertical direction, wherein the channel structure comprises a gate insulating layer on an inner wall of the channel hole, and a channel layer on the gate insulating layer, and wherein the second semiconductor layer contacts a side wall of the channel layer.

17. The nonvolatile memory device of claim 11, further comprising:

a third semiconductor layer between the second semiconductor layer and a lowest gate layer among the plurality of gate layers, wherein the insulating layer further extends between the conductive layer and the third semiconductor layer.

18. The nonvolatile memory device of claim 11, further comprising a lower conductive layer spaced apart from the second semiconductor layer with the first semiconductor layer therebetween, wherein the lower conductive layer has lower resistivity than a material of the first semiconductor layer, and wherein the lower conductive layer contacts the first semiconductor layer.

19. A nonvolatile memory device comprising:

a peripheral structure comprising a peripheral circuit;

a cell structure on the peripheral structure, the cell structure electrically connected to the peripheral structure;

wherein the cell structure includes a lower conductive layer;

a first semiconductor layer on the lower conductive layer;

a second semiconductor layer on the first semiconductor layer;

a stack structure including a plurality of gate layers and a plurality of interlayer insulating layers alternately stacked on the second semiconductor layer, the stack structure including a cell region and a step region being on one side of the cell region;

a channel structure in a channel hole passing through the cell region of the stack structure and extending in a vertical direction, the channel structure comprising a gate insulating layer on inner wall of the channel hole, and a channel layer on the gate insulating layer; and a plurality of dummy structures passing through the step region of the stack structure, each of the plurality of dummy structures comprising a conductive layer extending in the vertical direction and an insulating layer on a sidewall of the conductive layer, wherein the second semiconductor layer contacts a side wall of the channel layer, wherein the conductive layer contacts the first semiconductor layer, and wherein the insulating layer extends between the conductive layer and the stack structure.

20. The nonvolatile memory device of claim 19, wherein the conductive layer comprises a semiconductor material, a metal material, or a combination thereof.

* * * * *